US012761810B2

(12) United States Patent
Kwok et al.

(10) Patent No.: US 12,761,810 B2
(45) Date of Patent: Oct. 13, 2026

(54) BIT FLIPPING DECODER THRESHOLD CONTROLLING FOR ERROR CORRECTION IN MEMORY DEVICES

(71) Applicant: SK Hynix NAND Product Solutions Corp., Rancho Cordova, CA (US)

(72) Inventors: Zion Kwok, Burnaby (CA); Young Hoon Ji, Vancouver (CA); Cesar Enamorado Rodriguez, Vancouver (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 0 days.

(21) Appl. No.: 19/002,488

(22) Filed: Dec. 26, 2024

(65) Prior Publication Data

US 2026/0186668 A1 Jul. 2, 2026

(51) Int. Cl.

| | |
|---|---|
| ***G06F 12/00*** | (2006.01) |
| ***G06F 3/06*** | (2006.01) |
| ***H03M 13/11*** | (2006.01) |

(52) U.S. Cl.

CPC ............ *G06F 3/0619* (2013.01); *G06F 3/064* (2013.01); *G06F 3/0653* (2013.01); *G06F 3/0679* (2013.01); *H03M 13/1108* (2013.01)

(58) Field of Classification Search

None

See application file for complete search history.

(56) References Cited

U.S. PATENT DOCUMENTS

| | | | | |
|---|---|---|---|---|
| 11,984,910 | B1 * | 5/2024 | Fan | G06N 3/044 |
| 2018/0159553 | A1 | 6/2018 | Sharon et al. | |
| 2019/0103882 | A1 | 4/2019 | Hanham et al. | |
| 2020/0259511 | A1 | 8/2020 | Ha et al. | |
| 2022/0255561 | A1 | 8/2022 | Kaynak et al. | |
| 2022/0393703 | A1 | 12/2022 | Zhang et al. | |
| 2024/0061586 | A1 * | 2/2024 | Kuo | G06F 11/10 |

(Continued)

OTHER PUBLICATIONS

Wang, H.-Y., Wang, Z.-X., & Shang, S. (2024). An Improved Low-Density Parity-Check Decoder and Its Field-Programmable Gate Array Implementation. Applied Sciences, 14(12), 5162. https://doi.org/10.3390/app14125162 (Year: 2024).*

(Continued)

*Primary Examiner* — Daniel D Tsui

(74) *Attorney, Agent, or Firm* — Morgan, Lewis & Bockius LLP

(57) ABSTRACT

This application is directed to correcting errors in a data block. Data bits of the data block correspond to variable nodes and check nodes. For each check node, an electronic device determines check node data indicating whether respective variable nodes satisfy a data validity condition. For a first variable node, the electronic device determines a conversion factor indicating a quality of the check node data of the check nodes with reference to variable node data of the first variable node, identifies a first set of check nodes for which the variable node data of the first variable node are applied to determine the check node data of each of the first set of check nodes, determines a flip threshold based on the conversion factor, and determines whether to flip the first variable node based on the flip threshold and the check node data of the first set of check nodes.

20 Claims, 17 Drawing Sheets

(56) References Cited

U.S. PATENT DOCUMENTS

2024/0072826 A1* 2/2024 Lu ...................... H03M 13/1111

OTHER PUBLICATIONS

"The Basics of Low-Density Parity Check Codes" https://en.Intwww.de/Channel_Coding/The_Basics_of_Low-Density_Parity_Check_Codes (Year: 2023).*

SK Hynix NAND Product Solutions Corp., PCT/US2025/061300, International Search Report and Written Opinion, Apr. 23, 2026, 11 pgs.

* cited by examiner $$v_m = u_0 + g \sum_{k=1, k \neq m}^{N} u_k$$

BIT FLIPPING DECODER THRESHOLD CONTROLLING FOR ERROR CORRECTION IN MEMORY DEVICES

RELATED APPLICATIONS

This application relates to U.S. patent application Ser. No. 19/002,493, filed Dec. 26, 2024, titled "Methods and Systems for Addressing Trapping Bits in Bit Flipping Decoders," and U.S. patent application Ser. No. 19/002,498, filed Dec. 26, 2024, titled "Scaling Factors in Low Density Parity Check," each of which is incorporated by reference in its entirety.

TECHNICAL FIELD

This application relates generally to memory management including, but not limited to, methods, systems, devices, and non-transitory computer-readable media for correcting erroneous data bits during data validation in a memory system (e.g., solid-state drive).

BACKGROUND

Memory is applied in a computer system to store instructions and data. The data are processed by one or more processors of the computer system according to the instructions stored in the memory. Multiple memory units are used in different portions of the computer system to serve different functions. Specifically, the computer system includes non-volatile memory that acts as secondary memory to keep data stored thereon if the computer system is decoupled from a power source. Examples of the secondary memory include, but are not limited to, hard disk drives (HDDs) and solid-state drives (SSDs). Min-sum is a popular algorithm for identifying and/or correcting bit errors of user data that is stored in the memory with integrity data (e.g., low-density parity-check (LDPC) codes). A memory controller is applied to identify and/or correct the bit errors based on the LDPC codes. During an integrity check process, the memory controller generates variable node data for each variable node associated with a respective data bit of the user data, facilitating determining a probability of the respective data bit being erroneous. An LDPC decoder is applied based on a min-sum algorithm (MS) involving a plurality of iterations for error correction. The MS-based decoder sometimes corrects bits inaccurately during each min-sum iteration and therefore, has to implement excessive iterations to correct inaccurate bit corrections.

SUMMARY

Various embodiments of this application are directed to methods, systems, devices, non-transitory computer-readable media for low-density parity check (LDPC), e.g., using a min-sum algorithm (MS), in a memory system (e.g., SSD). A min-sum decoder is used to decode LDPC codes may be used to correct bit errors. The min-sum decoder operates on variable nodes that represent codeword bits and check nodes that represent parity-check equations. More specifically, when LDPC codewords are decoded, data bits are flipped in the variable nodes, and a check node may be updated based on an XOR operation on connected variable nodes. This decoding process is repeated iteratively until every check equation corresponding to the check nodes is satisfied. A check equation is satisfied if an XOR operation result of the connected variable nodes in a Tanner Graph is 0.

Some implementations of this application are directed to selecting a set of bits to flip at a given iteration adaptively based on one or more of different parameters (e.g., iteration count, variable node degree, a number of bits that are flipping, input residual bit error rate (RBER), syndrome weight, an intrinsic log-likelihood ratio (LLR), syndrome weight fraction, extrinsic LLR, conversion factor). Some implementations of this application are directed to flipping or erasing bits that are not normally flipped to address trapping sets. Some implementations of this application are directed to applying a scaling factor to adjust variable node data (e.g., which are applied to determine whether to flip corresponding variable nodes). By these means, accurate and efficient error correction solutions are provided to manage variable node data of variable nodes of user data and enhance error correction strength and rate for a corresponding memory system (e.g., by completing error correction within a smaller number of iterations or flipping erroneous bits with a high accuracy level).

In one aspect, a method is implemented by a memory device for correcting data errors. The method includes obtaining a data block including a plurality of data bits and identifying a plurality of variable nodes and a plurality of check nodes. Each of the plurality of variable nodes corresponds to a distinct data bit of the plurality of data bits. The method includes for each of the plurality of check nodes, determining check node data indicating whether a respective set of variable nodes satisfies a data validity condition. The method further includes, for a first variable node, identifying a first set of check nodes for which the variable node data of the first variable node is applied to determine the check node data of each of the first set of check nodes, determining a conversion factor indicating a quality of the check node data of the first set of check nodes with reference to variable node data of the first variable node, determining a flip threshold based on the conversion factor, and determining whether to flip the first variable node based on the flip threshold and the check node data of the first set of check nodes.

In one aspect, a method is implemented by a memory device for correcting data errors. The method includes obtaining a data block including a plurality of data bits and identifying a plurality of variable nodes and a plurality of check nodes. Each of the plurality of variable nodes corresponds to a distinct data bit of the plurality of data bits. The method further includes implementing a plurality of decoding iterations by applying a first flipping scheme to flip a subset of respective variable nodes based on their respective flip thresholds during each decoding iteration, determining that the plurality of decoding iterations do not converge, and in accordance with a determination that the plurality of decoding iterations do not converge, applying a second flipping scheme to flip a next subset of variable nodes. The second flipping scheme is distinct from the first flipping scheme.

In one aspect, a method is implemented by a memory device for data validation. The method includes obtaining a data block including a plurality of data bits and identifying a plurality of variable nodes and a plurality of check nodes. Each of the plurality of variable nodes corresponds to a distinct data bit of the plurality of data bits. The method further includes, for each of the plurality of check nodes, determining check node data indicating whether a respective set of variable nodes satisfies a data validity condition. The method further includes for a first variable node, determining a conversion factor indicating a quality of the check node data of the plurality of check nodes with reference to variable node data of the first variable node, identifying a first set of check nodes for which the variable node data of the first variable node is applied to determine the check node data of each of the first set of check nodes, determining a scaling factor based on at least the conversion factor, and determining variable node data of the first variable node by at least applying the scaling factor to the check node data of the first set of check nodes.

Some implementations of this application include an electronic device (e.g., a storage device) that includes one or more processors and memory having instructions stored thereon, which when executed by the one or more processors cause the processors to perform any of the above methods on a memory system (e.g., SSDs).

Some implementations include a non-transitory computer readable storage medium storing one or more programs. The one or more programs include instructions, which when executed by one or more processors cause the processors to implement any of the above methods on a memory system (e.g., SSDs).

In some embodiments, the above methods, electronic devices, or non-transitory computer readable storage medium for managing LDPC-based check node data are also used in communication (e.g., wireless communication using 5G or Wi-Fi technology, satellite communications, Ethernet communication, and communication via fiber Optic networks).

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

Like reference numerals refer to corresponding parts throughout the several views of the drawings.

DETAILED DESCRIPTION

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices with digital video capabilities.

Figure 1:
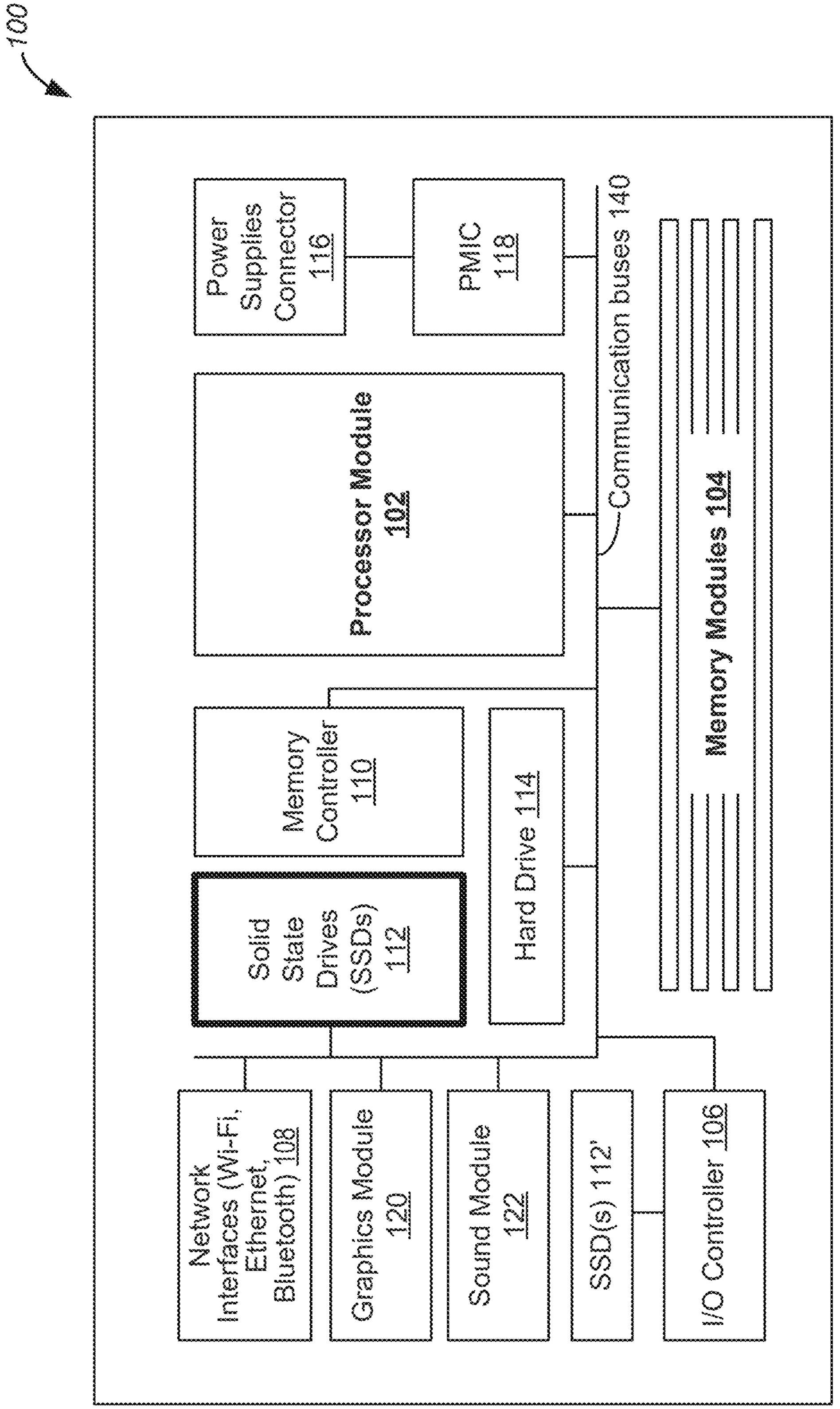
FIG. 1 is a block diagram of an example system module in a typical electronic device, in accordance with some embodiments.

FIG. 1 is a block diagram of an example system module 100 in a typical electronic system in accordance with some embodiments. The system module 100 in this electronic system includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a trackpad) via a universal serial bus interface. In some embodiments, the network interfaces 108 includes one or more interfaces for Wi-Fi, Ethernet and Bluetooth networks, each allowing the electronic system to exchange data with an external source, e.g., a server or another electronic system. In some embodiments, the communication buses 140 include circuitry (sometimes called a chipset) that interconnects and controls communications among various system components included in system module 100.

In some embodiments, the memory modules 104 include high-speed random-access memory, such as static random-access memory (SRAM), double data rate (DDR) dynamic random-access memory (DRAM), or other random-access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, SSD(s) 112, an HDD 114, power management integrated circuit (PMIC) 118, a graphics module 120, and a sound module 122. The memory controller 110 is configured to control communication between the processor module 102 and memory components, including the memory modules 104, in the electronic system. The SSD(s) 112 are configured to apply integrated circuit assemblies to store data in the electronic system, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V or 1.8V, as required by various components or circuits (e.g., the processor module 102) within the electronic system. The graphics module 120 is configured to generate a feed of output images to one or more display devices according to their desirable image/video formats. The sound module 122 is configured to facilitate the input and output of audio signals to and from the electronic system under control of computer programs.

Alternatively or additionally, in some embodiments, the system module 100 further includes SSD(s) 112' coupled to the I/O controller 106 directly. Conversely, the SSDs 112 are coupled to the communication buses 140. In an example, the communication buses 140 operates in compliance with Peripheral Component Interconnect Express (PCIe or PCIE), which is a serial expansion bus standard for interconnecting the processor module 102 to, and controlling, one or more peripheral devices and various system components including components 110-122.

Further, one skilled in the art knows that other non-transitory computer readable storage media can be used, as new data storage technologies are developed for storing information in the non-transitory computer readable storage media in the memory modules 104, SSD(s) 112 or 112', and HDD 114. These new non-transitory computer readable storage media include, but are not limited to, those manufactured from biological materials, nanowires, carbon nanotubes and individual molecules, even though the respective data storage technologies are currently under development and yet to be commercialized.

Some implementations of this application are directed to an integrity check process implemented by a memory system (e.g., SSD 112, memory module 104, HDD 114, memory controller 110), which stores codeword symbols including integrity data, e.g., LDPC codes. The integrity check process is also called a decoding process and visualized by a Tanner graph with variable nodes and check nodes. The variable nodes correspond to the codeword symbols extracted from the memory system. Each check node corresponds to a distinct set of variable nodes, and has check node data configured to identify or correct bit errors in the codeword symbols corresponding to the distinct set of variable nodes. Specifically, messages are exchanged between the variable and check nodes on the Tanner graph to update the variable node data and check node data, until the bit errors are identified and corrected in the codeword symbols.

Figure 2:
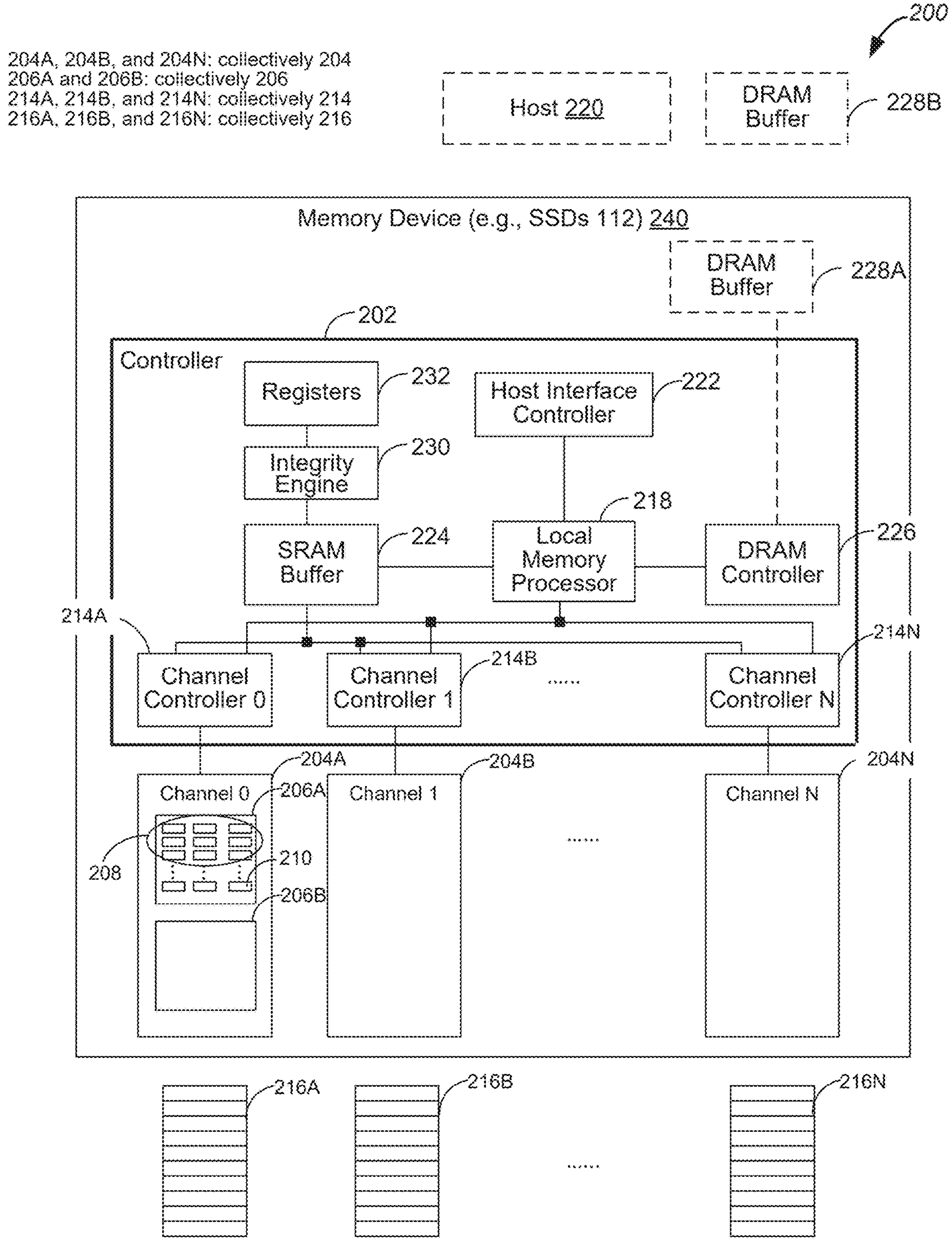
FIG. 2 is a block diagram of a memory system of an example electronic device having one or more memory access queues, in accordance with some embodiments.

FIG. 2 is a block diagram of a memory system 200 of an example electronic device having one or more memory access queues, in accordance with some embodiments. The memory system 200 is coupled to a host device 220 (e.g., a processor module 102 in FIG. 1) and configured to store instructions and data for an extended time, e.g., when the electronic device sleeps, hibernates, or is shut down. The host device 220 is configured to access the instructions and data stored in the memory system 200 and process the instructions and data to run an operating system and execute user applications. The memory system 200 includes one or more memory devices 240 (e.g., SSD(s)). Each memory device 240 further includes a controller 202 and a plurality of memory channels 204 (e.g., channel 204A, 204B, and 204N). Each memory channel 204 includes a plurality of memory cells. The controller 202 is configured to execute firmware level software to bridge the plurality of memory channels 204 to the host device 220. In some embodiments, each memory device 240 is formed on a printed circuit board (PCB).

Each memory channel 204 includes on one or more memory packages 206 (e.g., two memory dies). In an example, each memory package 206 (e.g., memory package 206A or 206B) corresponds to a memory die. Each memory package 206 includes a plurality of memory planes 208, and each memory plane 208 further includes a plurality of memory pages 210. Each memory page 210 includes an ordered set of memory cells, and each memory cell is identified by a respective physical address. In some embodiments, the memory device 240 includes a plurality of superblocks. Each superblock includes a plurality of memory blocks each of which further includes a plurality of memory pages 210. For each superblock, the plurality of memory blocks are configured to be written into and read from the memory system via a memory input/output (I/O) interface concurrently. Optionally, each superblock groups memory cells that are distributed on a plurality of memory planes 208, a plurality of memory channels 204, and a plurality of memory dies 206. In an example, each superblock includes at least one set of memory pages, where each page is distributed on a distinct one of the plurality of memory dies 206, has the same die, plane, block, and page designations, and is accessed via a distinct channel of the distinct memory die 206. In another example, each superblock includes at least one set of memory blocks, where each memory block is distributed on a distinct one of the plurality of memory dies 206 includes a plurality of pages, has the same die, plane, and block designations, and is accessed via a distinct channel of the distinct memory die 206. The memory device 240 stores information of an ordered list of superblocks in a cache of the memory device 240. In some embodiments, the cache is managed by a host driver of the host device 220, and called a host managed cache (HMC).

In some embodiments, the memory device 240 includes a single-level cell (SLC) NAND flash memory chip, and each memory cell stores a single data bit. In some embodiments, the memory device 240 includes a multi-level cell (MLC) NAND flash memory chip, and each memory cell of the MLC NAND flash memory chip stores 2 data bits. In an example, each memory cell of a triple-level cell (TLC) NAND flash memory chip stores 3 data bits. In another example, each memory cell of a quad-level cell (QLC) NAND flash memory chip stores 4 data bits. In yet another example, each memory cell of a penta-level cell (PLC) NAND flash memory chip stores 5 data bits. In some embodiments, each memory cell can store any suitable number of data bits. Compared with the non-SLC NAND flash memory chips (e.g., MLC SSD, TLC SSD, QLC SSD, PLC SSD), the SSD that has SLC NAND flash memory chips operates with a higher speed, a higher reliability, and a longer lifespan, and however, has a lower device density and a higher price.

Each memory channel 204 is coupled to a respective channel controller 214 (e.g., controller 214A, 214B, or 214N) configured to control internal and external requests to access memory cells in the respective memory channel 204. In some embodiments, each memory package 206 (e.g., each memory die) corresponds to a respective queue 216 (e.g., queue 216A, 216B, or 216N) of memory access requests. In some embodiments, each memory channel 204 corresponds to a respective queue 216 of memory access requests. Further, in some embodiments, each memory channel 204 corresponds to a distinct and different queue 216 of memory access requests. In some embodiments, a subset (less than all) of the plurality of memory channels 204 corresponds to a distinct queue 216 of memory access requests. In some embodiments, all of the plurality of memory channels 204 of the memory device 240 corresponds to a single queue 216 of memory access requests. Each memory access request is optionally received internally from the memory device 240 to manage the respective memory channel 204 or externally from the host device 220 to write or read data stored in the respective channel 204. Specifically, each memory access request includes one of: a system write request that is received from the memory device 240 to write to the respective memory channel 204, a system read request that is received from the memory device 240 to read from the respective memory channel 204, a host write request that originates from the host device 220 to write to the respective memory channel 204, and a host read request that is received from the host device 220 to read from the respective memory channel 204. It is noted that system read requests (also called background read requests or non-host read requests) and system write requests are dispatched by a memory controller to implement internal memory management functions including, but are not limited to, garbage collection, wear levelling, read disturb mitigation, memory snapshot capturing, memory mirroring, caching, and memory sparing.

In some embodiments, in addition to the channel controllers 214, the controller 202 further includes a local memory processor 218, a host interface controller 222, an SRAM buffer 224, and a DRAM controller 226. The local memory processor 218 accesses the plurality of memory channels 204 based on the one or more queues 216 of memory access requests. In some embodiments, the local memory processor 218 writes into and read from the plurality of memory channels 204 on a memory block basis. Data of one or more memory blocks are written into, or read from, the plurality of channels jointly. No data in the same memory block is written concurrently via more than one operation. Each memory block optionally corresponds to one or more memory pages. In an example, each memory block to be written or read jointly in the plurality of memory channels 204 has a size of 16 KB (e.g., one memory page). In another example, each memory block to be written or read jointly in the plurality of memory channels 204 has a size of 64 KB (e.g., four memory pages). In some embodiments, each page has 16 KB user data and 2 KB metadata. Additionally, a number of memory blocks to be accessed jointly and a size of each memory block are configurable for each of the system read, host read, system write, and host write operations.

In some embodiments, the local memory processor 218 stores data to be written into, or read from, each memory block in the plurality of memory channels 204 in an SRAM buffer 224 of the controller 202. Alternatively, in some embodiments, the local memory processor 218 stores data to be written into, or read from, each memory block in the plurality of memory channels 204 in a DRAM buffer 228A that is included in memory device 240, e.g., by way of the DRAM controller 226. Alternatively, in some embodiments, the local memory processor 218 stores data to be written into, or read from, each memory block in the plurality of memory channels 204 in a DRAM buffer 228B that is main memory used by the processor module 102 (FIG. 1). The local memory processor 218 of the controller 202 accesses the DRAM buffer 228B via the host interface controller 222.

Figure 3:
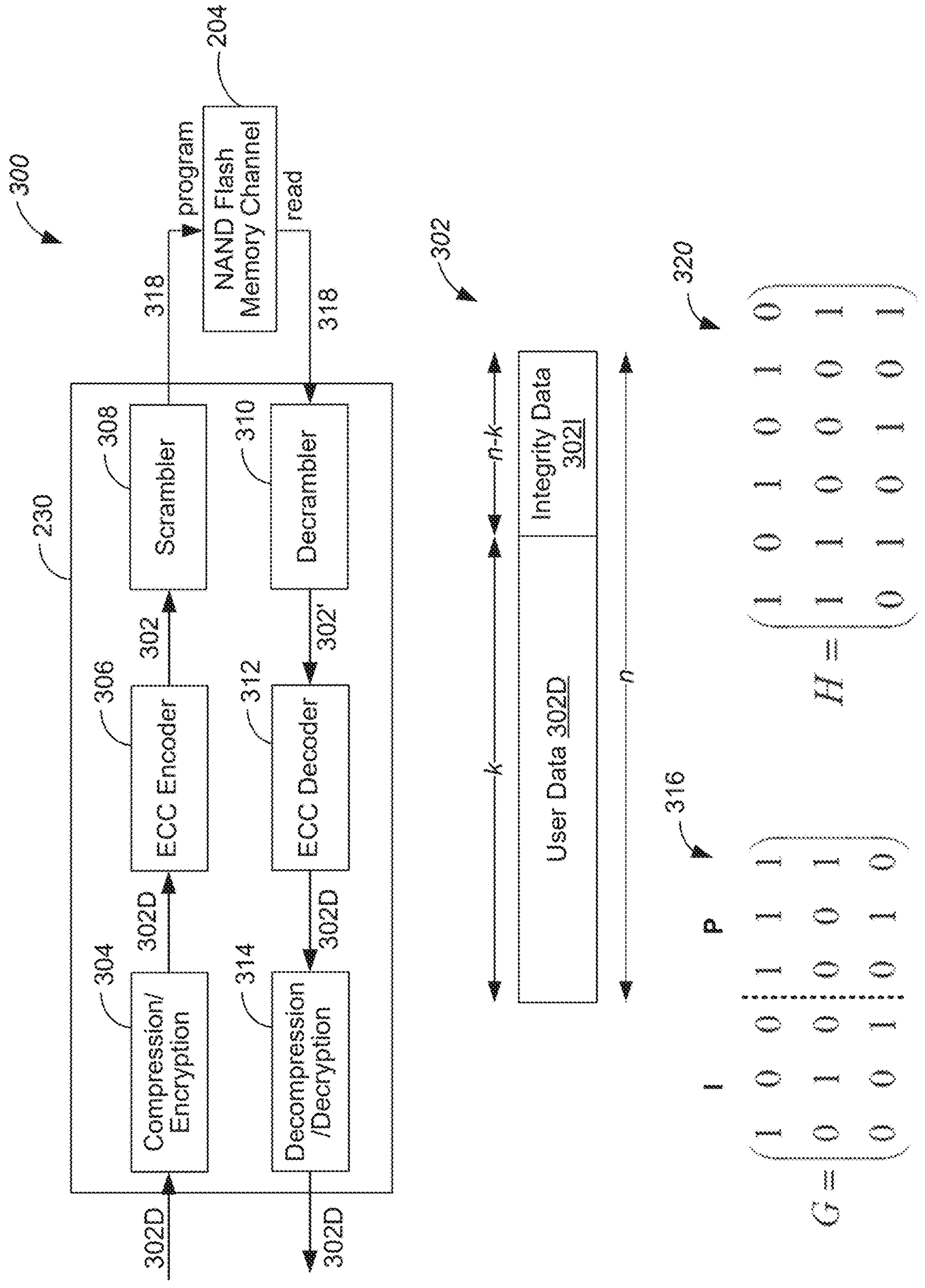
FIG. 3 is a block diagram of an example integrity check system of a memory system for processing a codeword, in accordance with some embodiments.

In some embodiments, data in the plurality of memory channels 204 is grouped into coding blocks, and each coding block is called a codeword (FIG. 3, 302). For example, each codeword includes n bits among which k bits correspond to user data and (n-k) corresponds to integrity data of the user data, where k and n are positive integers. In some embodiments, the memory system 200 includes an integrity engine 230 (e.g., an LDPC engine) and a registers 232 including a plurality of registers or SRAM cells or flip-flops and coupled to the integrity engine 230. The integrity engine 230 is coupled to the memory channels 204 via the channel controllers 214 and SRAM buffer 224. Specifically, in some embodiments, the integrity engine 230 has data path connections to the SRAM buffer 224, which is further connected to the channel controllers 214 via data paths that are controlled by the local memory processor 218. The integrity engine 230 is configured to verify data integrity for each coding block of the memory channels 204 using variable nodes and check nodes, and messages are exchanged between the variable and check nodes during the integrity check process. A subset of these messages is selected and temporarily stored in the registers 232 as variable node data or check node data.

FIG. 3 is a block diagram of an example integrity check system 300 of a memory system 200 for processing a codeword 302, in accordance with some embodiments. The integrity check system 300 includes a plurality of memory channels 204, an integrity engine 230 (e.g., an LDPC engine), and a registers 232. Data stored in memory channels 204 of the memory system 200 (FIG. 2) is grouped into coding blocks, and each coding block is called a codeword 302. The codeword 302 also called a data block 302 or a block 302 of data. Each codeword 302 further includes n data bits among which k data bits are user data 302D and (n−k) data bits are integrity data 302I of the user data 302D, where k and n are positive integers. The integrity check system 300 is configured to verify data integrity for each codeword 302 of the memory channels 204 using variable nodes 404 and check nodes 402 (FIG. 4).

In some embodiments, the integrity engine 230 further includes one or more of: a compression module 304, an error correction code (ECC) encoder 306, a scrambler 308, a descrambler 310, an ECC decoder 312, and a decompression module 314. The compression module 304 obtains user data 302D and processes (e.g., compresses, encrypts) the user data 302D. The ECC encoder 306 obtains the user data 302D that is optionally processed by the compression module 304, and applies a parity data generation matrix G (316) on the user data 302D to encode the codeword 302. The matrix G (316) has k rows and n columns. A systematic form of the matrix G includes an identify matrix I configured to preserve the user data 302D within the codeword 302 and a parity matrix P configured to generate the integrity data 302I from the user data 302D. In some embodiments, the matrix G (316) is not unique and includes a set of basis vectors for a vector space of valid codewords 302. The scrambler 308 obtains the codeword 302 including n data bits and converts the n data bits to a scrambled codeword 318 having a seemingly random output string of n data bits. The scrambled codeword 318 is stored in the memory channels 204 of the memory system 200.

During decoding, the scrambled codeword 318 is extracted from the memory channel 204 of the memory system 200. The descrambler 310 recovers a codeword 302' from the scrambled codeword 318, and the ECC decoder 312 verifies whether the recovered codeword 302' is valid and corrects erroneous bits in the recovered codeword 302, thereby providing the valid codeword 302 including the valid user data 302D. In some embodiments, the decompression module 314 obtains the user data 302D and processes (e.g., decompresses, decrypts) the user data 302D. In some embodiments, for integrity check, the ECC decoder 312 applies a parity-check matrix H (320) on the recovered codeword 302' to generate a syndrome vector S. The parity check matrix H (320) includes n-k rows corresponding to n-k parity check equations and n columns corresponding to n codeword bits. A relationship of the recovered codeword 302' and the syndrome vector s is represented as follows:

$$S=yH^T \tag{1}$$

where y is the recovered codeword 302'. In some embodiments, in accordance with a determination that the syndrome s is equal to 0, the ECC decoder 312 determines that all parity-check equations associated with the parity-check matrix H are satisfied and that the recovered codeword 302' is valid. Conversely, in accordance with a determination that the syndrome is not equal to 0, the ECC decoder 312 determines that at least a predefined number (e.g., one, two) parity check equation associated with the parity-check matrix H is not satisfied and that the recovered codeword 302' is not valid. Alternatively, in some embodiments, the ECC decoder 312 operates to solve the following equation:

$$S=eH^T \tag{2}$$

where e is an error vector. The syndrome vector s is a combination of the error vector e and a valid codeword 302. Given that the syndrome vector s and the parity check matrix H are known, the ECC decoder 312 solves equation (2) to obtain the error vector e and identify the erroneous bits in the recovered codeword 302'.

Figure 4A:
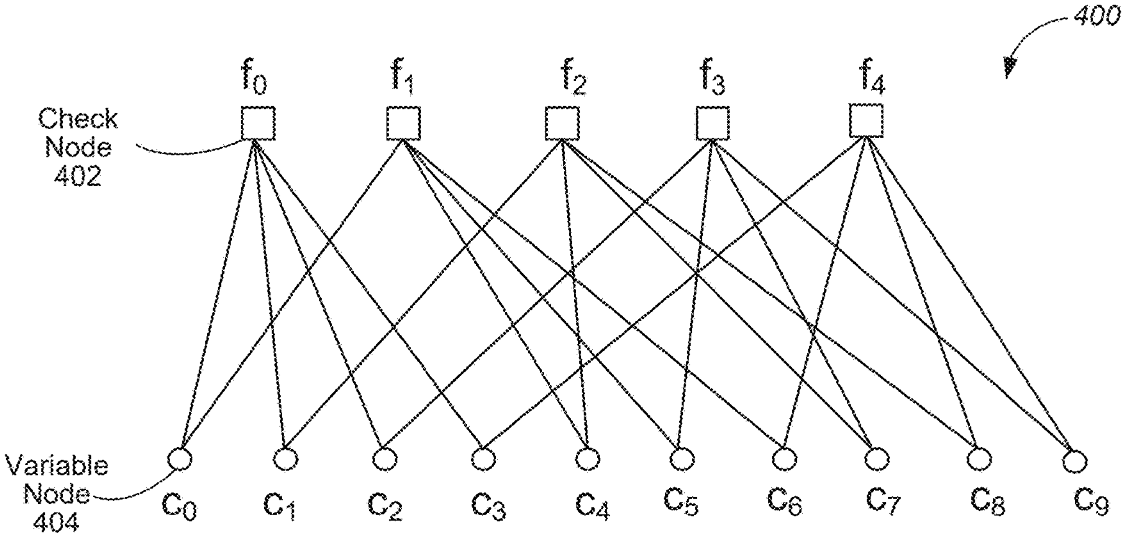
FIG. 4A is a Tanner graph applied to implement LDPC coding using check nodes and variable nodes, in accordance with some embodiments.

FIG. 4A is a Tanner graph 400 applied to implement LDPC coding using check nodes 402 and variable nodes 404, in accordance with some embodiments. Data stored in a memory system 200 (FIG. 2) is verified on a codeword basis. Each codeword 302 includes n data bits among which k data bits are user data 302D and n-k data bits are integrity data 302I of the user data 302D, where k and n are positive integers. In some embodiments, the parity check matrix H (320) is applied without differentiating the user data 302D and the integrity data 302I during integrity check. The parity-check matrix H (320) includes n-k rows corresponding to n-k parity-check equations and n columns corresponding to n codeword bits, where k and n are positive integers. Each parity-check equation combines corresponding n codeword bits (also called codeword symbols), and therefore, corresponds to a check node 402 that is connected up to a subset or all of the n variable nodes 404. In some embodiments, only j codeword bits in the n codeword bits correspond to 1 in the parity check matrix H (320) for a row corresponding to check node 402, where j is an integer less than n, and the check node 402 is connected to the j variable nodes 404. In some embodiments, each and every check node 402 is connected to the same number of variable nodes 404 (e.g. j variable nodes 404). Alternatively, in some embodiments, each check node 402 is connected to a respective number of variable nodes 404, and at least two check nodes 402 are connected to different numbers of variable nodes 404.

Referring to FIG. 4A, in this example, the codeword 302 has 10 codeword symbols (also called codeword bits). Five parity check equations are applied to do integrity check on the codeword 302, and each parity check equation is applied on a set of four codeword symbols (j=4). As such, the Tanner graph 400 includes five check nodes 402 ($f_0$-$f_4$) and each check node 402 is connected to four respective variable nodes 404 each corresponding to a distinct set of four codeword symbols of the codeword 302.

In some embodiments, the ECC decoder 312 solves equation (2) to obtain the error vector e and identify one or more erroneous bits in the codeword 302 by an iterative integrity check process. Messages are exchanged between the variable nodes 404 and check nodes 402 on the Tanner graph 400 until the one or more erroneous bits are identified or corrected in the codeword 302. Each variable node 404 is assigned with initial variable node data. In some embodiments, the initial variable node data includes a log-likelihood ratio (LLR) that is determined based on data measured when a read reference voltage is adjusted for the memory system 200. Each check node 402 is connected to a set of variable nodes 404, and receives messages including the initial variable node data from the set of variable nodes 404. For each check node 402, the check node data is determined based on the initial variable node data of the set of variable nodes 404, and indicates a likelihood of a set of codeword symbols corresponding to the set of variable nodes 404 being erroneous. Conversely, each variable node 404 is also connected to a set of check nodes 402 on the Tanner graph 400, and receives messages including the check node data from the set of check nodes 402. For each variable node 404, variable node data is updated based on the check node data 422 of the set of variable nodes 404. By these means, the messages are exchanged between the check nodes 402 and variable nodes 404 until an integrity check requirement is satisfied, and the one or more erroneous bits are identified or corrected based on the variable node data or the check node data. In some embodiments, the integrity check requirement is satisfied when sign 424 is 0 for all check nodes 402.

Figure 4B:
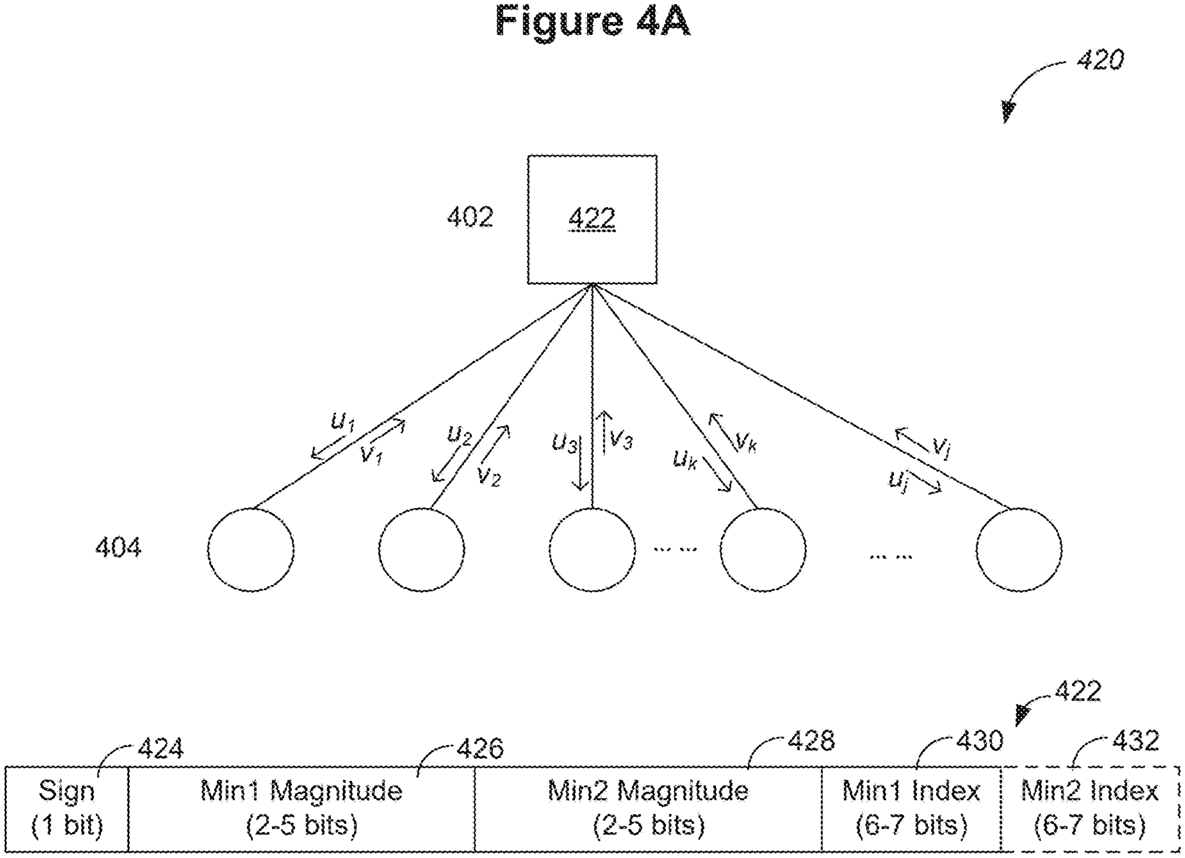
FIG. 4B is a simplified Tanner graph having a single check node coupled to a set of variable nodes, in accordance with some embodiments.

FIG. 4B is a simplified Tanner graph 420 having a single check node 402 coupled to a set of variable nodes 404, in accordance with some embodiments. Check node 402 receives variable-to-check node message data $v_1$, $v_2$, $v_3$, . . . $v_j$ from j variable nodes 404, where j is also known as the degree of the check node, dc. After a check node update is performed based on a min-sum algorithm, check node 402 sends check-to-variable node message data $u_1$, $u_2$, $u_3$, . . . $u_j$ to de variable nodes 404. Details about the check node update calculation for k, where k is an integer in the range [1, $d_c$], are as follows:

$$u_k = \left( \prod_{m=1, m \neq k}^{d_c} \text{sign}(v_m) \times \min_{m \neq k} |v_m| \right) \quad (3)$$

$$\text{sign}(u_k) = \left( \prod_{m=1, m \neq k}^{d_c} \text{sign}(v_m) \right) \quad (4)$$

$$|u_k| = \min_{m \neq k} |v_m| = \begin{cases} \text{Min2 Magnitude}, & k = \text{Min1 Index} \\ \text{Min1 Magnitude}, & k \neq 1 \text{ Index} \end{cases} \quad (5)$$

where Min1 and Min2 correspond to two variable nodes 404 having the most minimum variable-to-check node message magnitude and the second minimum variable-to-check node message magnitude, respectively. The check node data 422 includes a sign bit 424, a first likelihood data item 426 (Min1 Magnitude), a second likelihood data item 428 (Min2 Magnitude), and a first index data item 430 (Min1 Index). In accordance with equation (4), the sign bit 424 is generated based on signs of the variable-check node message data ($v_1$-$v_m$) from the set of variable nodes 404. Stated another way, the sign bit 424 is a combination of signs of respective likelihood data items of a subset of codeword symbols corresponding to the set of variable nodes 404. The first likelihood data item 426 and the second likelihood data item 428 include magnitudes of the most minimum variable-to-check node message data (Min1) and the second minimum variable-to-check node message data (Min2) of the set of variable nodes 404, respectively. The first index data item 430 identifies one of the set of variable nodes 404 corresponding to the first likelihood data item 426. In some embodiments, the check node data 422 further includes a second index data item 432 identifying a second one of the set of variable nodes 404 corresponding to the second likelihood data item 428.

Figure 4C:
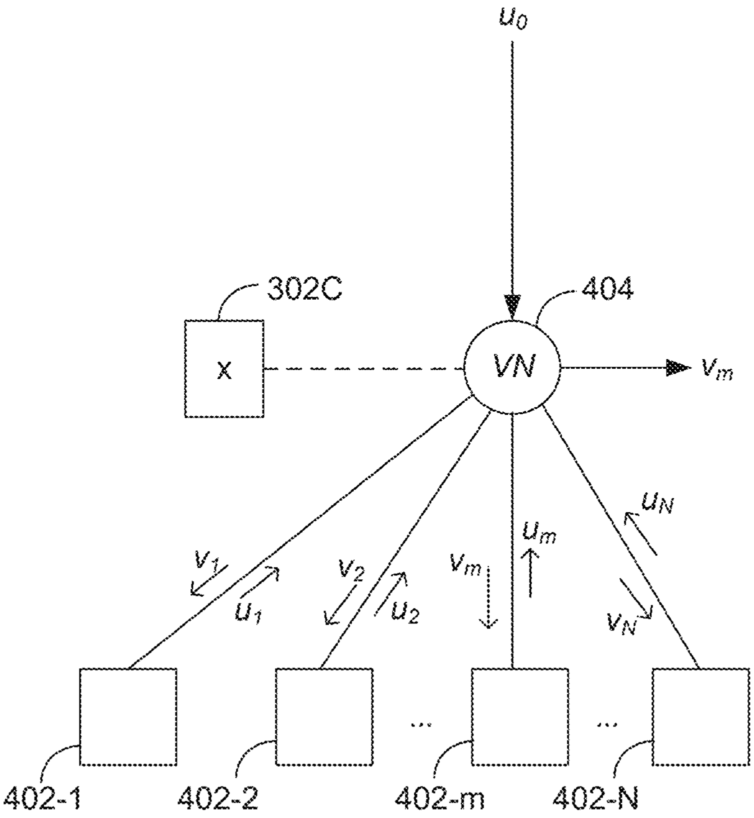
FIG. 4C is another simplified Tanner graph having a single variable node coupled to a set of check nodes, in accordance with some embodiments.

FIG. 4C is another simplified Tanner graph 420 having a single variable node 404 coupled to a set of check nodes 402, in accordance with some embodiments. Each single variable node 404 corresponds to a first data bit 302C (e.g., $c_0$, $c_1$, . . . , $c_9$ in FIG. 4A) of the codeword 302. Data bit is also called codeword symbol. The variable node 404 receives check-to-variable node message data $u_1$, $u_2$, $u_3$, . . . $u_N$ (also called check node data) from N check nodes 402, where N is also known as a degree of the variable node 404. When a variable node update is performed based on a min-sum algorithm, each of the N check nodes 402 sends check-to-variable node message data $u_1$, $u_2$, $u_3$, . . . $u_N$ to the same variable node 404. Variable-to-check node message data $v_m$ (also called variable node data) is further generated based on the check-to-variable node message data $u_1$-$u_N$, and sent from the variable node 404 to an m-th check node of the set of check nodes 402, where m is an integer in the range [1, N]. The variable-to-check node message data $v_m$ is represented as follows:

$$v_m = u_0 + \sum_{k=1, k \neq m}^{N} u_k \quad (6)$$

where $u_0$ is an intrinsic likelihood of the first data bit 302C in an example. In another example, $u_0$ is an intrinsic likelihood of the first data bit 302C being a logic bit 1. In yet another example, $u_0$ is an intrinsic likelihood of the first data bit 302C being erroneous. In some embodiments, a scaling factor g is used to multiply a sum of check-to-variable node message data, and the sum and an intrinsic likelihood $u_0$ (also called input LLR) in the variable node update are combined to generate the variable-to-check node message data $v_m$ as follows:

$$v_m = u_0 + g \sum_{k=1, k \neq m}^{N} u_k \quad (7)$$

where g is the scaling factor.

Figure 5A:
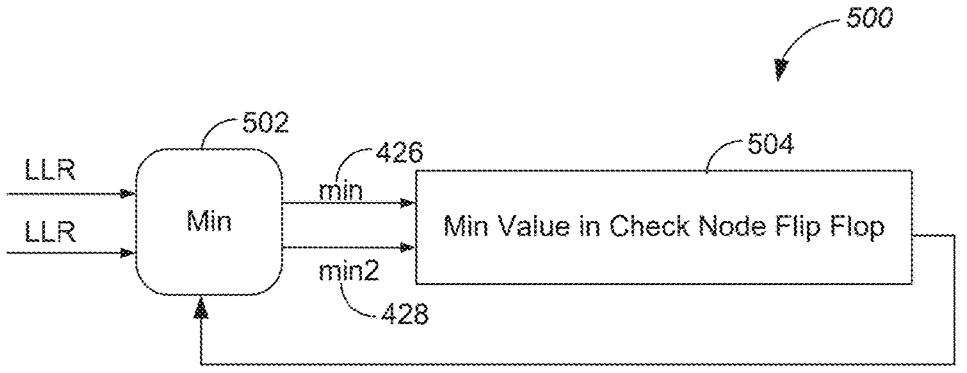
FIG. 5A is a schematic diagram of a sequence of check node operations implemented to determine check node data of a check node during LDPC decoding, in accordance with some embodiments.

FIG. 5A is a schematic diagram of a sequence of check node operations 500 implemented to determine check node data of a check node 402 during LDPC decoding, in accordance with some embodiments. LDPC decoding is performed based on a min-sum method. An integrity engine 230 (FIG. 2) organizes a plurality of arithmetic units and a registers 232 to implement an instruction corresponding to the min-sum method without frequently interacting with a local memory processor 218. Specifically, each check node 402 corresponds to a parity-check equation that combines corresponding n codeword symbols (also called codeword bits), and is connected to a subset of the n variable nodes 404. In some embodiments, only j codeword symbols in the n codeword symbols are associated with nonzero coefficients in the parity-check equation, and the check node 402 is connected to the j variable nodes 404. For each check node 402, the plurality of arithmetic units includes a comparator operator 502 coupled to flip-flops 504 in a registers 232 (FIG. 2). The comparator operator 502 receives variable-to-check node message data from a subset of the j variable nodes 404 connected to the check node 402, and check node data 422, and determines the first likelihood data item 426 and the second likelihood data item 428, corresponding to the most minimum variable-to-check node message data (Min1) and the second minimum variable-to-check node message data (Min2) of the set of j variable nodes 404, respectively. The first likelihood data item 426 and the second likelihood data item 428 are stored into the flip flops 504 of the registers 232. In some embodiments, the variable-to-check node message data from each of the set of j variable nodes 404 includes an LLR that is determined based on data measured when a read reference voltage is adjusted for the memory system 200.

Figure 5B:
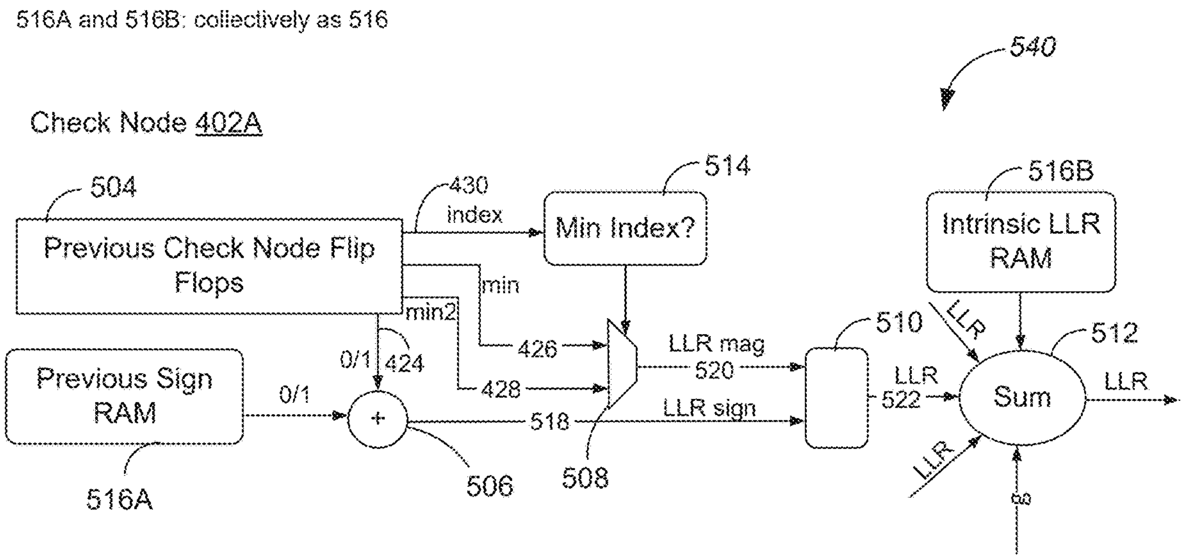
FIG. 5B is a schematic diagram of a sequence of variable node operations implemented to determine variable node data of a variable node during LDPC decoding, in accordance with some embodiments.

FIG. 5B is a schematic diagram of a sequence of check node and variable node operations 540 implemented to determine variable-to-check node message data $v_m$ from a variable node 404 during LDPC decoding, in accordance with some embodiments. For each variable node 404, the plurality of arithmetic units organized by the integrity engine 230 includes a sign operator 506, a multiplexer 508, a combiner 510, a sum operator 512, an index identifier 514, and one or more random access memory (RAM) 516. The RAM 516 stores data involved in the check node and variable node operations 540 temporarily. In some embodiments, the registers 232 further includes the RAM 516 associated with these check node and variable node operations 540. Each variable node 404 is connected to a set of check nodes 402, and applied in a set of parity-check equations corresponding to the set of check nodes 402. One of the set of check nodes 402 corresponds to check node data stored in the flip-flops 504 and including a sign bit 424, a first likelihood data item 426, a second likelihood data item 428, and a first index data item 430. A previous variable-to-check node message data sign stored in a RAM 516A is combined with the sign bit 424 by the sign operator 506 to form an LLR sign 518. The index identifier 514 compares an index k of the variable node 404, which uniquely identifies one variable node 404 among the j variable nodes connected to one check node 402, with the first index data item 430. In accordance with a comparison result, the multiplexer 508 selects one of the likelihood data items 426 and 428 as a likelihood data item 520, and the combiner 510 generates a signed LLR data item 522 that is sent from check node 402 to variable node 404 based on the LLR sign 518 and likelihood data item 520 (e.g., a value of $u_k$ in equations (6) and (7)). Specifically, in some embodiments, in accordance with a determination that the index k of the variable node 404 is equal to the first index data item 430, the multiplexer 508 selects the second likelihood data item 428 as the likelihood data item 520 (e.g., a value of $u_k$ in equations (6) and (7)). Conversely, in some embodiments, in accordance with a determination that the index k of the variable node 404 is not equal to the first index data item 430, the multiplexer 508 selects the first likelihood data item 426 as the likelihood data item 520.

In some embodiments, intrinsic LLR data (e.g., intrinsic likelihood $u_0$) corresponds to initial variable node data of each variable node 404 associated with a respective codeword symbol of a codeword 302. The intrinsic LLR data is determined based on a log-likelihood ratio (LLR) that is approximated as follows:

$$LLR(y) = \ln\frac{p(x=0\,|\,y)}{p(x=1\,|\,y)} = \ln\frac{p(y\,|\,x=0)}{p(y\,|\,x=1)} \tag{8}$$

where p(|) is a probability of a combination of data values, x is a value stored for the respective codeword symbol, and y is a correct value of the respective codeword symbol. The intrinsic LLR data is determined based on data measured when a read reference voltage is adjusted for the memory system 200.

The sum operator 512 combines intrinsic LLR data stored in the RAM 516B, LLR data items 522 (e.g., $u_k$ in equations (6) and (7)), and scaling factor g for the set of check nodes 402 to update the variable node data (e.g., variable-to-check node message data vm) associated with the variable node 404.

Determination of Bit Flipping Decoder Thresholds

Figure 6:
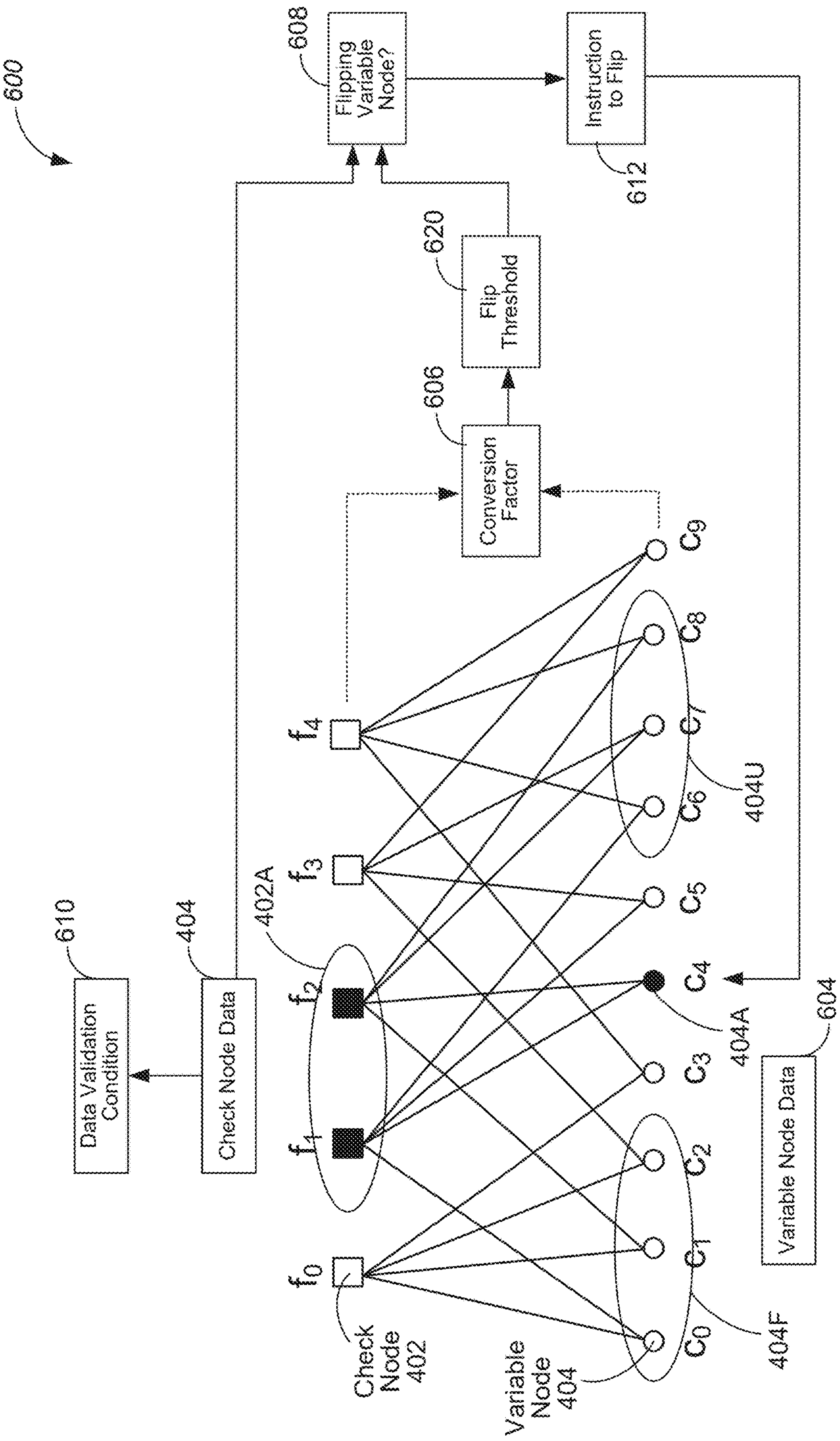
FIG. 6 is a flow diagram of an example process of correcting errors in a data block 302, in accordance with some embodiments.

FIG. 6 is a flow diagram of an example process 600 of correcting errors in a data block 302, in accordance with some embodiments. The process 600 is implemented by a memory controller 202 to validate a block of data 302 and correct one or more bit errors in the block of data 302 during the course of reading the block of data 302 from associated non-volatile memory (e.g., memory channels 204). LDPC decoding includes one or more decoding iterations, and a data bit may be flipped during a subset or all of the one or more decoding iterations. For a bit error, a corresponding bit is flipped to correct the bit error during one or an odd number of decoding iterations. In some embodiments, a set of bits are selected to be flipped at a given iteration, and each flipped bit is connected to one or more check nodes 402 that do not satisfy a data validity condition 610. Each check node 402 and a respective set of variable nodes satisfy the data validity condition 610 if the respective set of variable nodes is correct and does not need to be flipped, and do not satisfy the data validity condition 610 if at least one of the respective set of variable nodes is incorrect and needs to be flipped.

In some embodiments, during a decoding iteration, the variable nodes 404 associated with the block of data 302 includes a subset of variable nodes 404F that is selected for flipping and a remainder set of variable nodes 404U that is not selected for flipping. Further, in an example, each of the subset of variable nodes 404F is connected to a larger numbers of unsatisfied check nodes 402 than any variable node of the remainder set of variable nodes 404U. Alternatively, in an example, each of the subset of variable nodes 404F selected for flipping is connected to a first number unsatisfied check nodes and a second number of satisfied check nodes, and the first number is greater than the second number. Alternatively, in some embodiments, each of the subset of variable nodes 404F is selected by comparing a number of unsatisfied check nodes determined for the respective variable node 404F with a flip threshold 620, and the flip threshold 620 is determined based on one or more of an iteration count, a variable node degree, and/or a number of bits that are flipping during the decoding iteration.

In some embodiments, the data block 302 includes a plurality of data bits (e.g., corresponding to user data 302D or integrity data 302I). The plurality of data bits correspond to a plurality of variable nodes 404 and a plurality of check nodes 402, and each of the plurality of variable nodes 404 corresponds to a distinct data bit of the plurality of data bits of the data block 302. For each of the plurality of check nodes 402, check node data 602 is determined (e.g., during each LDPC decoding iteration) to indicate whether the respective check node 402 and a respective set of variable nodes 404 satisfy a data validity condition 610. For a first variable node 404A (e.g., $C_4$), a conversion factor 606 is determined to indicate a quality of the check node data 602 of the first set of check nodes 402A with reference to variable node data 604 of the first variable node 404A. The first variable node 404A corresponds to a first set of check nodes 402A, and the variable node data 604 of the first variable node 404A is applied to determine the check node data 602 of each of the first set of check nodes 402A. The flip threshold 620 is determined based on the conversion factor 606. During an LDPC decoding iteration, the memory controller 202 determines (operation 608) whether to flip the first variable node 404A based on the flip threshold 620 and the check node data 602 of the first set of check nodes 402A. In some embodiments, in accordance with a determination that the first variable node 404A needs to be flipped, an instruction 612 is generated to flip the first variable node 404A. Conversely, in some embodiments, in accordance with a determination that the first variable node 404A does not need to be flipped, the memory controller 202 does not flip the first variable node 404A.

Figure 7:
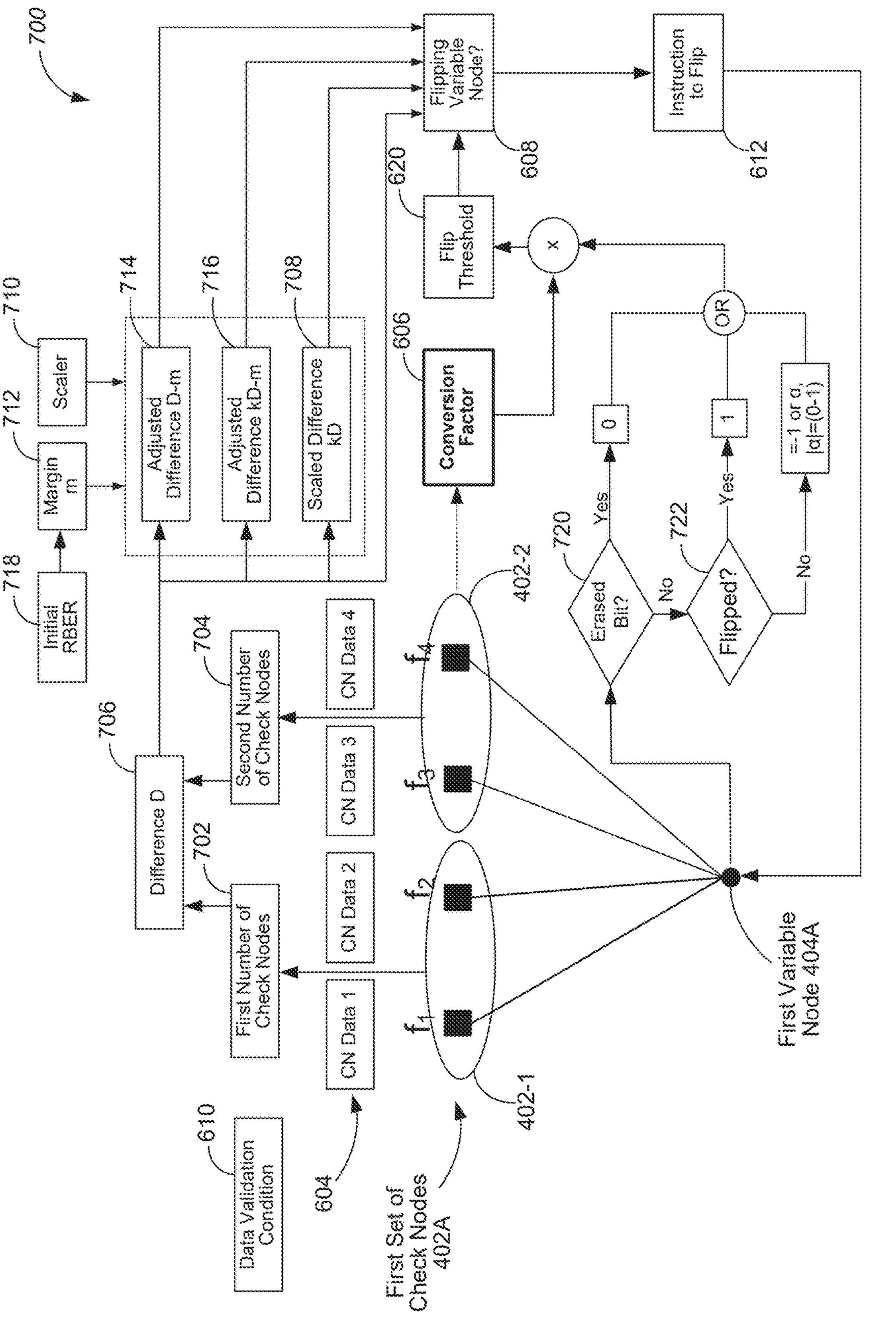
FIG. 7 is a flow diagram of a detailed process of correcting errors in a data block 302, in accordance with some embodiments.

FIG. 7 is a flow diagram of a detailed process 700 of correcting errors in a data block 302, in accordance with some embodiments. A first variable node 404A corresponds to a first set of check nodes 402A, and the variable node data 604 of the first variable node 404A is applied to determine the check node data 602 of each of the first set of check nodes 402A according to a Tanner graph 400. A memory device 240 determines a conversion factor 606 for the first variable node 404A (e.g., $C_4$), indicating a quality of the check node data 602 of the plurality of check nodes 402 (more specifically, the first set of check nodes 402A) with reference to variable node data 604 of the first variable node 404A. A flip threshold 620 is determined based on the conversion factor 606. The memory device 240 determines whether to flip the first variable node 404A based on the flip threshold 620 and the check node data 602 of the first set of check nodes 402A.

In some embodiments, based on the check node data 602 of the first set of check nodes 402A, the memory device 240 determines a first subset of check nodes 402-1 and a second subset of check nodes 402-2. Each of the first subset of check nodes 402-1 corresponds to a respective set of variable nodes that does not satisfy the data validity condition 610 (e.g., indicating that at least one of the respective set of variable nodes is invalid). For each of the second subset of check nodes 402-2, the respective set of variable nodes satisfies the data validity condition 610 (e.g., indicating that all of the respective set of variable nodes is valid). The memory device 240 determines a first number 702 of check nodes in the first subset of check nodes 402-1, a second number 704 of check nodes in the second subset 402-2 of check nodes, and determining a difference 706 of the first number 702 and the second number 704. Whether to flip the first variable node 404A is determined based the flip threshold 620 and the difference 706.

Stated another way, in some embodiments, the first number 702 (e.g., #unsatisfied check nodes, #satisfied check nodes), the second number 704, and the conversion factor 606 satisfy the following equations:

$$(\#\text{unsatisfied check nodes} - \#\text{satisfied check nodes}) + (\text{flipped?} - \text{conversion factor:conversion factor}) > 0 \quad (9)$$

$$(\#\text{unsatisfied check nodes} - \#\text{satisfied check nodes}) > (\text{flipped?} - \text{conversion factor:conversion factor}) \quad (10)$$

Further, in some embodiments, in accordance with a determination that the difference 706 exceeds the flip threshold 620, the memory device 240 flips the first variable node 404A. In some embodiments, the memory device 240 scales the difference to generate a scaled difference 708 (e.g., using a scaler 710), and in accordance with a determination that the scaled difference 708 exceeds the flip threshold 620, the memory device 240 flips the first variable node 404A. In some embodiments, the memory device 240 adjusts the difference 706 by a margin value 712 to generate an adjusted difference 714, and in accordance with a determination that the adjusted difference 714 exceeds the flip threshold 620, the memory device 240 flips the first variable node 404A. In some embodiments, the memory device 240 scales the difference 706 by a scaler 710 to generate a scaled difference, which is further adjusted by a margin value 712 to generate an adjusted difference 716. The flip threshold 620 is scaled to generate a scaled flip threshold. In accordance with a determination that the adjusted difference 716 exceeds the scaled flip threshold, the memory device 240 flips the first variable node 402A.

Additionally, in some embodiments, the margin 712 is determined based on an initial RBER 718 and the conversion factor 606. In some embodiments, the margin 712 is reduced for lower initial RBERs to increase an average rate of convergence without much risk to the codeword (e.g., the data block 302) being uncorrectable. Under some circumstances, in the first few iterations, variable nodes 402 having a low degree (e.g., having a variable node degree lower than a threshold number) may not flip. When all of the bit errors are in variable nodes with low degree, the memory controller 202 may never try to flip the variable nodes having errors.

In some situations, there is noise in the RBER estimation based on an initial syndrome weight and values of extrinsic LLR and intrinsic LLR. The margin 712 is applied. If the difference 706 of the unsatisfied and satisfied check nodes for the first variable node 404A exceeds the flip threshold 620 by a larger margin compared to another variable node, the first variable node 404A should be flipped first. The memory device increases the flip threshold 620 to reduce a probability of flipping correct bits into error bits. However, the memory device 240 may run out of variable nodes that have a large margin, and selectively reduce the flip threshold 620 without applying the margin. In some implementations, the memory device 240 never applies a negative margin 712 to reduce the flip threshold 620. When the margin 712 is applied, the first number 702 (e.g., #unsatisfied check nodes, #satisfied check nodes), the second number 704, and the conversion factor 606 satisfy the following equation:

$$(\#\text{unsatisfied check nodes} - \#\text{satisfied check nodes}) + \text{margin} > (\text{flipped?conversion factor:conversion factor}) \quad (11)$$

In some embodiments, the margin 712 is a real number, rather than an integer. In some embodiments, the memory device applies a scaler 710, which may result in an integer margin 712 and an integer flip threshold. When the scaler 710 is applied, the first number 702 (e.g., #unsatisfied check nodes, #satisfied check nodes), the second number 704, and the conversion factor 606 satisfy the following equation:

$$k \times (\#\text{unsatisfied check nodes} - \#\text{satisfied check nodes}) + k \times \text{margin} > k \times (\text{flipped?conversion factor: conversion factor}) \quad (12)$$

In some embodiments, in accordance with a determination that the first variable node 404A corresponds to an erased bit 720, the memory device 240 sets the conversion factor to 0.

In some embodiments, the memory device 240 determines the flip threshold 620 based on the conversion factor 606. In some embodiments, the memory device 240 determines (operation 722) whether the first variable node 404A is flipped in a last decoding iteration. The last decoding iteration precedes a current decoding iteration, and may or may not be a decoding iteration that immediately precedes the current decoding iteration. In accordance with a determination that the first variable node 404A is flipped in the last decoding iteration, the memory device 240 sets the flip threshold 620 to the conversion factor 606, thereby increasing the flip threshold 620 and making bit flipping harder to occur. Conversely, in accordance with a determination that the first variable bit 404A is not flipped in the last decoding iteration, the memory device 240 sets the flip threshold 620 to a product of the conversion factor and −1, thereby reducing the flip threshold 620 and making bit flipping easier to occur. Alternatively, in some embodiments, in accordance with a determination that the first variable bit 404A is not flipped in a last decoding iteration, the memory device 240 sets the flip threshold 620 to a product of the conversion factor 606 and a scaling value $\alpha$. An absolute value of the scaling value $\alpha$ is between 0 to 1, e.g., in a range of (0, 1) exclusively.

Figure 8:
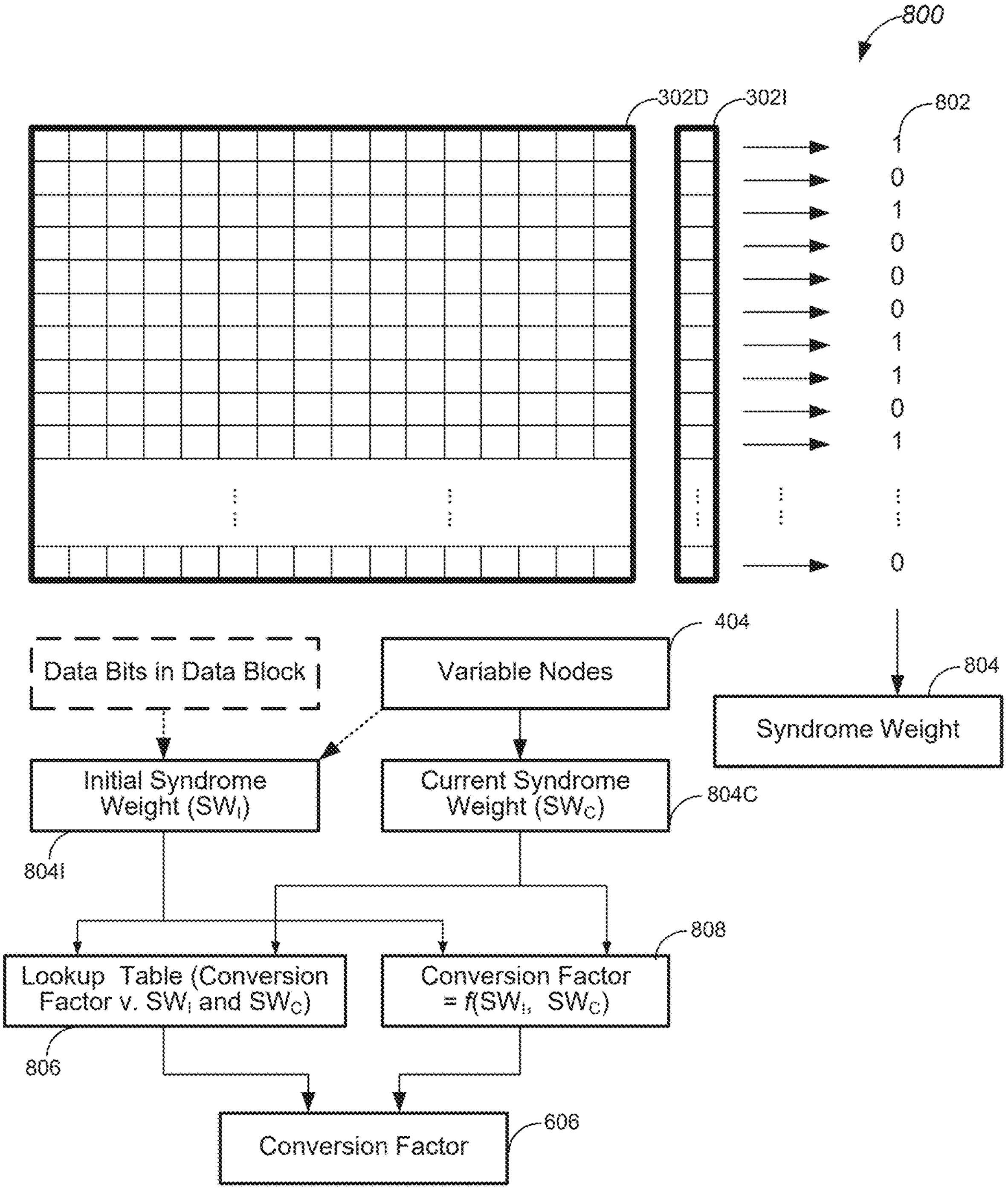
FIG. 8 is a flow diagram of an example process of correcting error bits based on syndrome weights of a data block, in accordance with some embodiments.

FIG. 8 is a flow diagram of an example process 800 of correcting error bits based on syndrome weights 804 of a data block 302, in accordance with some embodiments. A memory device 240 determines a syndrome weight 804 of a data block 302 (e.g., a codeword 302 in FIG. 3) during each decoding iteration or when there is at least one bit flipping. The memory device 240 (specifically, a controller 202 in FIG. 2) applies a plurality of validation operations by applying each respective validation operation of the plurality of validation operations on the data block to generate a corresponding validity result 802 indicating whether the respective validation operation has succeeded. Further, in some embodiments, each validation operation includes an XOR-based parity check on a subset of the data block 302.

In some embodiments, the respective validity result 802 is equal to a first validity result (e.g., "1") indicating that the respective validation operation has failed, and a corresponding check node 402 does not satisfy the data validity condition 610. In some embodiments, the respective validity result 802 is equal to a second validity result (e.g., "0") indicating that the respective validation operation has succeeded, and a corresponding check node 402 satisfies the data validity condition 610. The memory device 240 determines that the plurality of validity results 802 include a number of first validity results and determines the syndrome weight 804 based on the number of first validity results. Additionally, in some embodiments, the syndrome weight 804 is defined as a ratio of the number of first validity results of a total number of the plurality of validity results. In some embodiments, the controller 218 of the memory device 240 has an on-die LDPC syndrome calculator for determining the syndrome weight 804.

Stated another way, in some embodiments, each validity result 802 corresponds to a check node 402 and represents check node data 602 of the check node. When a validity result 802 is equal to the first validity value, the check node data 602 and associated variable node data 604 do not satisfy the data validity condition 610. The syndrome weight 804 is defined as a particular number of check nodes that do not satisfy the data validity condition 610 or a ratio of the particular number and a total number of check nodes 402 of the data block 302.

In some embodiments, the data block 312 sampled to determine the syndrome weight 804 has a memory size (MS), e.g., 1 KB. Each validation operation includes an XOR-based parity check on N data bits (e.g., 16 bits) of the user data 302D and 1 data bit of the integrity data 302I. The plurality of validation operations includes M validation operations, where MS is equal to a product of N and M. No data bit of the user data 302D and the integrity data 302I is used in more than one validation operation, and the integrity data has M bits. For example, the memory size MS is 1 KB (i.e., 8,192 bits). M and N are integers, and for example, equal to 512 and 16, respectively.

In some embodiments, the memory device 240 determines an initial syndrome weight 804I ($SW_I$) based on the plurality of data bits and a current syndrome weight 804C ($SW_C$) based on the check node data 602 of the plurality of check nodes 402. The checking a predetermined lookup table 806 or mathematical formula 808 associating the conversion factor 606 with the initial syndrome weight 804I ($SW_I$) and the current syndrome weight 804C (SWC) to determine the conversion factor 606. In some situations, for a fixed check node degree, the conversion factor 606 (e.g., ×10) is plotted as a function of the initial syndrome weight 804I ($SW_I$) and the current syndrome weight 804C ($SW_C$), and correspond to an improvement (e.g., 5%) of more bit errors being corrected. For the same number of bit errors, the conversion factor 606 reduces the number of uncorrectable codewords by up to 10 times. Also, for high bit error cases, a smaller number of decoding iterations are needed to correct errors, thereby enhancing a latency for reading data blocks from a non-volatile memory of the memory device 240.

Figure 9:
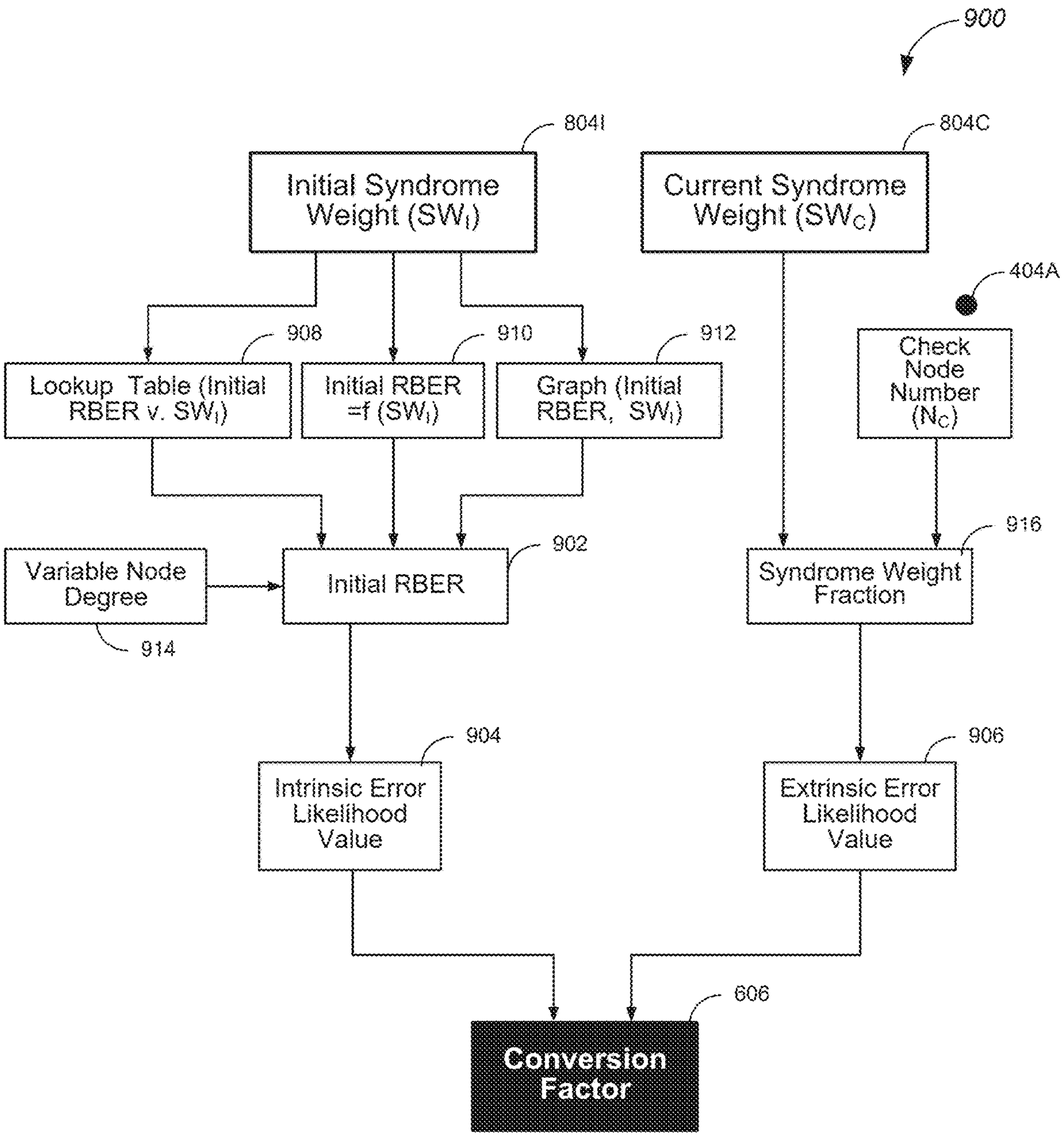
FIG. 9 is a flow diagram of an example bit flipping process applied in LDPC decoding, in accordance with some embodiments.

FIG. 9 is a flow diagram of an example bit flipping process 900 applied in LDPC decoding, in accordance with some embodiments. In some embodiments, the data block 302 includes a plurality of data bits (e.g., corresponding to user data 302D or integrity data 302I). The plurality of data bits correspond to a plurality of variable nodes 404 and a plurality of check nodes 402, and each of the plurality of variable nodes 404 corresponds to a distinct data bit of the plurality of data bits of the data block 302. For each of the plurality of check nodes 402, check node data 602 is determined (e.g., during each LDPC decoding iteration) to indicate whether the respective check node 402 and a respective set of variable nodes 404 satisfy a data validity condition 610. In some embodiments, each variable node (e.g., the first check node 404A) is connected to a respective set of check nodes 402 (e.g., the first set of check nodes 402A) including a respective number of check nodes ($N_C$). The memory device 240 determines an input residual bit error rate (RBER) 902 of the plurality of variable nodes 404. The memory device 240 further determines an intrinsic error likelihood value 904 based on the input RBER 902, and an extrinsic error likelihood value 906 for each variable node 404 based on the respective number of check nodes ($N_C$). The conversion factor 606 is determined as a ratio of the intrinsic error likelihood value 904 and the extrinsic error likelihood value 906.

Further, in some embodiments, the memory device 240 determines an initial syndrome weight 804I ($SW_I$) and checks a pre-determined graph 908, lookup table 910, or mathematical formula 912 describing a relationship of the initial syndrome weight 804I ($SW_I$) and the input RBER 902 to determine to the input RBER 902 based on the initial syndrome weight 804I ($SW_I$) In some embodiments, the memory device 240 determines the input RBER 902 based on the initial syndrome weight 804I ($SW_I$) and a variable node degree 914, which may be defined as a number of check nodes 402 connected to a respective variable node 404. In some embodiments, the initial RBER 718, the input RBER 902 and the initial syndrome weight 804I ($SW_I$) are determined before any validation operation (e.g., using XOR operations). Alternatively, in some embodiments, the initial RBER 718, the input RBER 902 and the initial syndrome weight 804I ($SW_I$) are determined during one or more earliest decoding iterations, e.g., after one or more bits are flipped. In some embodiments, the initial RBER 902 and the input RBER 718 are exchangeable. In some embodiments, the initial RBER 902 includes, but is not limited to, the input RBER 718.

In some embodiments, the memory device 240 determines a current syndrome weight 804C ($SW_C$) based on the check node data 602 of the plurality of check nodes 402, and determining a syndrome weight fraction 916 (SWR) as a ratio between the current syndrome weight 804C and the number of check nodes ($N_C$) connected to a particular variable node 404 (e.g., the first variable node 404A). The intrinsic error likelihood value 904 (ILV) and the extrinsic error likelihood value 906 (ELV) are represented as follows:

$$IVR=(1-\text{input RBER})/(\text{input RBER}) \text{ and } EVR=(1-SWR)/SWR \quad (13)$$

In some embodiments, the memory device 240 estimates the input RBER 902 by calculating the syndrome and counting the syndrome weight, which is the same as counting RBER by calculating the syndrome and counting the syndrome weight, which is the same as counting the number of unsatisfied check nodes near the beginning of decoding. In some implementations, LDPC simulations are executed to plot a graph of RBER with respect to the syndrome weight. Alternatively, in some implementations, the memory device 240 calculates a binomial probability that a given check equation would be unsatisfied based on the number of connected variable nodes and the input RBER 902. The binomial probability of being a unsatisfied check node is converted to a syndrome weight divided by the number of check nodes. Alternatively, in some implementations, the memory device 240 uses a lookup table or mathematical function that receives the syndrome weight and generates the input RBER 902. In some embodiments, a probability that a random input bit is correct is represented by the intrinsic error likelihood value 904 (ILV) in equations (13). During decoding, the memory device 240 determines the syndrome and count the syndrome weight on a regular basis, e.g., providing the syndrome weight fraction 916 for each variable node 404 as a ratio between the current syndrome weight 804C and the number of check nodes ($N_C$) connected to the respective variable node 404.

In some embodiments, for given variable node (e.g., the first variable node 404A in FIG. 6), a probability that the contribution of other variable nodes to this check equation is 1 based on the syndrome weight fraction 916. The probability that the check node value gives good information about this particular variable node is 1-SWR. The probability that a random check node gives good information as an extrinsic error likelihood value 906 (ELV), which is represented in equations (13). The conversion factor 606 is a ratio of the intrinsic error likelihood value 904 (ILV) and the extrinsic error likelihood value 906 (ELV), indicating a relative quality of check node value with respect to an input bit value, and may be applied to make a decision regarding whether or not to flip a bit corresponding to a variable node 404.

For a given variable node (e.g., the first variable node 404A in FIG. 6), the memory device 240 counts the number of satisfied and unsatisfied check nodes connected to the given variable node. If equation (10) is satisfied, the memory device 240 flips the bit. In some embodiments, for erased bits, there is no input bit value, and the memory device 240 checks if a number of unsatisfied check nodes connected to the erased bit is greater than a number of satisfied check nodes connected to the erased bit.

Figure 10:
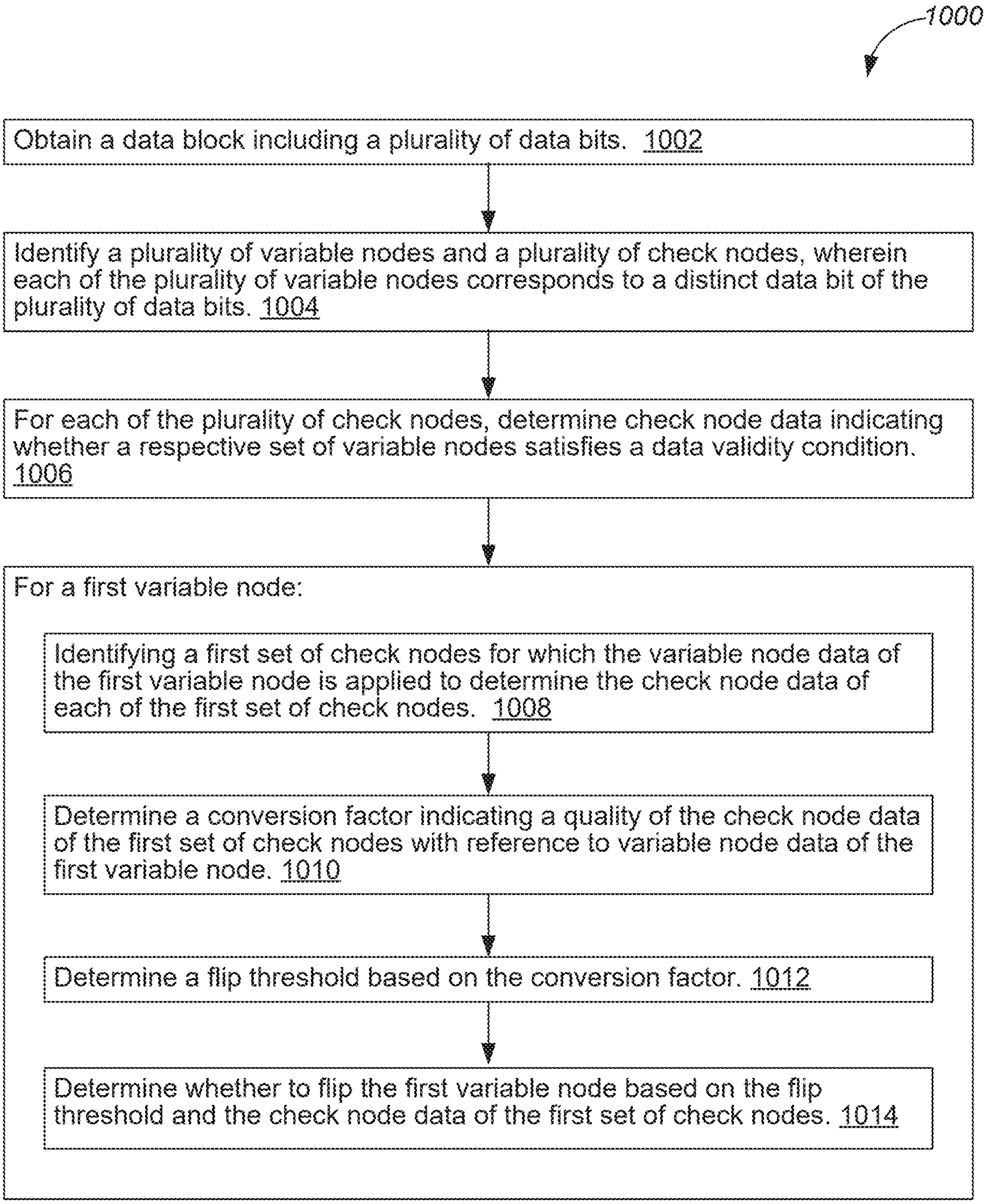
FIG. 10 is a flow diagram of an example process of correcting data bits in a block of data, in accordance with some embodiments.

FIG. 10 is a flow diagram of an example method 1000 of correcting data bits in a block of data, in accordance with some embodiments. The method 1000 is implemented by a memory device 240 (FIG. 2). The memory device 240 obtains (operation 1002) a data block including a plurality of data bits and identifies (operation 1004) a plurality of variable nodes and a plurality of check nodes. Each of the plurality of variable nodes corresponds to a distinct data bit of the plurality of data bits. For each of the plurality of check nodes, the memory device 240 determines (operation 1006) check node data indicating whether a respective set of variable nodes satisfies a data validity condition. For a first variable node, the memory device 240 identifies (operation 1008) a first set of check nodes for which the variable node data of the first variable node is applied to determine the check node data of each of the first set of check nodes, determines (operation 1010) a conversion factor indicating a quality of the check node data of the first set of check nodes with reference to variable node data of the first variable node, determines (operation 1012) a flip threshold based on the conversion factor, and determines (operation 1014) whether to flip the first variable node based on the flip threshold and the check node data of the first set of check nodes.

In some embodiments, based on the check node data of the first set of check nodes, the memory device 240 determines a first subset of check nodes and a second subset of check nodes. For each of the first subset of check nodes, the respective set of variable nodes does not satisfy the data validity condition, and for each of the second subset of check nodes, the respective set of variable nodes satisfies the data validity condition. The memory device 240 determines a first number of check nodes in the first subset of check nodes and a second number of check nodes in the second subset of check nodes. The memory device 240 determines a difference of the first number and the second number, wherein whether to flip the first variable node is determined based the flip threshold and the difference. Further, in some embodiments, in accordance with a determination that the difference exceeds the flip threshold, the memory device 240 flips the first variable node.

In some embodiments, the memory device 240 scales the difference to generate a scaled difference. In accordance with a determination that the scaled difference exceeds the flip threshold, the memory device 240 flips the first variable node. In some embodiments, the memory device 240 adjusts the difference by a margin value to generate an adjusted difference. In accordance with a determination that the adjusted difference exceeds the flip threshold, the memory device 240 flips the first variable node. In some embodiments, the memory device 240 scales the difference to generate a scaled difference, adjusts the scale difference by a margin value to generate an adjusted difference, and scales the flip threshold to generate a scaled flip threshold. In accordance with a determination that the adjusted difference exceeds the scaled flip threshold, the memory device 240 flips the first variable node. Further, in some embodiments, the memory device 240 determines the margin based on an initial RBER and the conversion factor.

In some embodiments, the memory device 240 determines the flip threshold based on the conversion factor by determining whether the first variable bit is flipped in a last decoding iteration. In accordance with a determination that the first variable node is flipped in the last decoding iteration, the memory device 240 sets the flip threshold to the conversion factor. In accordance with a determination that the first variable bit is not flipped in the last decoding iteration, the memory device 240 sets the flip threshold to a product of the conversion factor and −1.

In some embodiments, the memory device 240 determines the flip threshold based on the conversion factor, by in accordance with a determination that the first variable bit is not flipped in a last decoding iteration, setting the flip threshold to a product of the conversion factor and a scaling value, wherein an absolute value of the scaling value is between 0 to 1.

In some embodiments, the memory device 240 determines the conversion factor by determining an initial syndrome weight based on the plurality of data bits, determining a current syndrome weight based on the check node data of the plurality of check nodes, and checking a predetermined lookup table or mathematical formula associating the conversion factor with the initial syndrome weight and the current syndrome weight to determine the conversion factor.

In some embodiments, for each variable node 404, a corresponding set of check nodes connected to the variable node on the Tanner graph 400 includes a number of check nodes ($N_C$). The memory device 240 determines a conversion factor by determining an input residual bit error rate (RBER) of the plurality of variable nodes, determining an intrinsic error likelihood value based on the input RBER, determining an extrinsic error likelihood value based on the number of check nodes ($N_C$), and determining the conversion factor as a ratio of the intrinsic error likelihood value and the extrinsic error likelihood value. Further, in some embodiments, the memory device 240 determines an initial syndrome weight and checks a pre-determined graph, lookup table, or mathematical formula describing a relationship of the initial syndrome weight and the input RBER to determine to the input RBER based on the initial syndrome weight.

In some embodiments, the memory device 240 determines an initial syndrome weight and a variable node degree. The input RBER is determined based on the initial syndrome weight and the variable node degree.

In some embodiments, the memory device 240 determines the input RBER by determining a current syndrome weight ($SW_C$) based on the check node data of the plurality of check nodes and determining a syndrome weight fraction (SWR) as a ratio between the syndrome weight and the number of check nodes ($N_C$). The intrinsic error likelihood value (ILV) and the extrinsic error likelihood value (ELV) is represented based on equations (13).

In some embodiments, the memory device 240 sets the conversion factor to 0 in accordance with a determination that the first variable node corresponds to an erased bit.

Memory is also used to store instructions and data associated with the method 1000, and includes high-speed random-access memory, such as SRAM, DDR DRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 1000. Alternatively, in some embodiments, the electronic device implements the method 1000 at least partially based on an ASIC. The memory system 200 of the electronic device includes an SSD in a data center or a client device.

Solving Trapping Sets with the Bit Flipping Decoder

Figure 11:
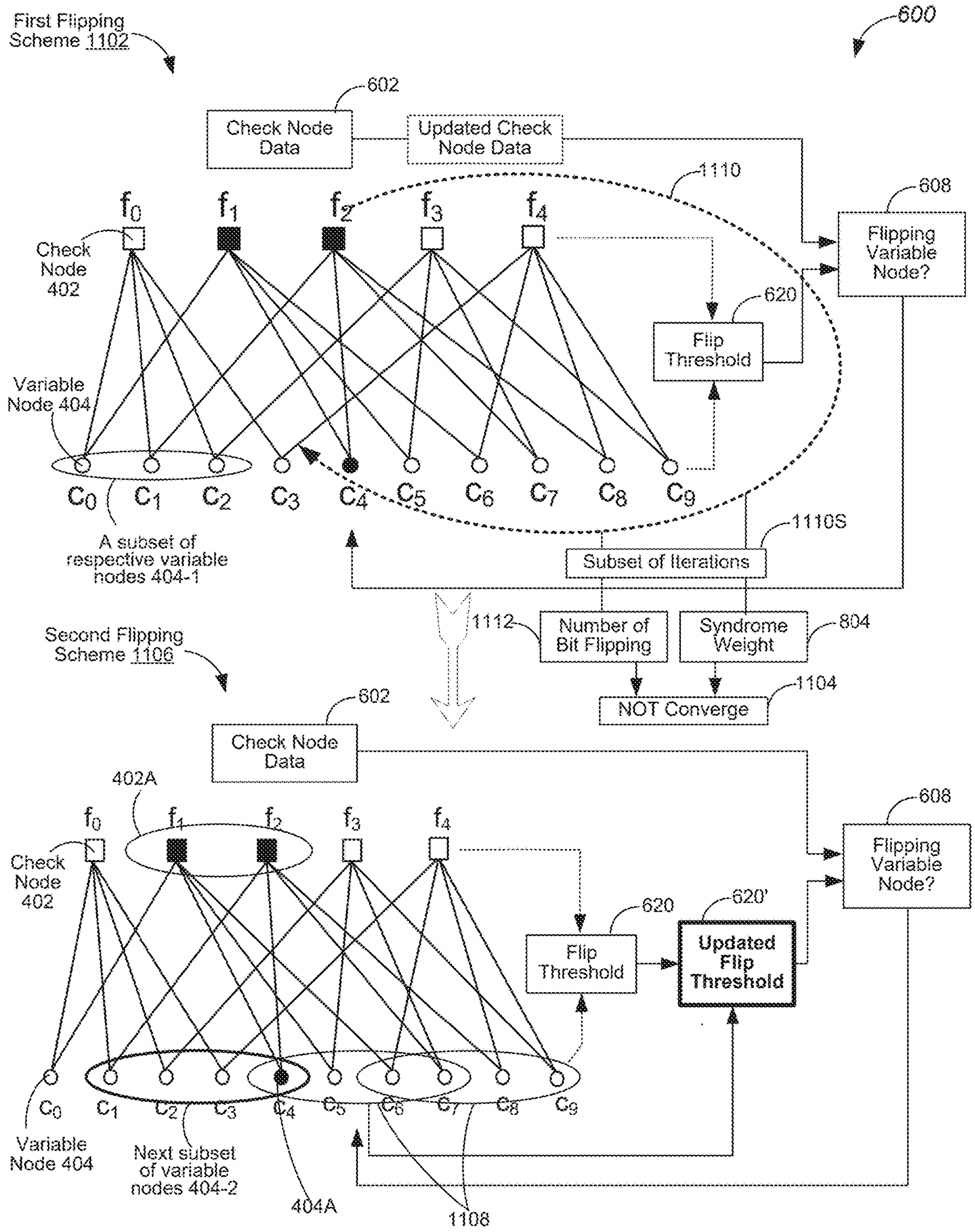
FIG. 11 is a flow diagram of an example process of applying two flipping schemes in LDPC decoding, in accordance with some embodiments.

FIG. 11 is a flow diagram of an example process 1100 of applying two flipping schemes in LDPC decoding, in accordance with some embodiments. The process 1100 is implemented by a memory controller 202 to validate a block of data 302 and correct one or more bit errors in a block of data 302 during the course of reading the block of data 302 from associated non-volatile memory (e.g., memory channels 204). In some embodiments, the data block 302 includes a plurality of data bits (e.g., corresponding to user data 302D or integrity data 302I). The plurality of data bits correspond to a plurality of variable nodes 404 and a plurality of check nodes 402, and each of the plurality of variable nodes 404 corresponds to a distinct data bit of the plurality of data bits of the data block 302. For each of the plurality of check nodes 402, check node data 602 is determined (e.g., during each LDPC decoding iteration) to indicate whether the respective check node 402 and a respective set of variable nodes 404 satisfy a data validity condition 610.

The memory device 240 implements a plurality of decoding iterations 1110 by applying a first flipping scheme 1102 to flip a subset of respective variable nodes 404-1 based on their respective flip thresholds 620 during each decoding iteration 1110. The memory device 240 determines that the plurality of decoding iterations do not converge (operation 1104). In accordance with a determination that the plurality of decoding iterations 1110 do not converge, the memory device 240 applies a second flipping scheme 1106 to flip a next subset of variable nodes 404-2. The second flipping scheme 1106 is distinct from the first flipping scheme 1102. In some embodiments, the second flipping scheme 1106 is associated with the first flipping scheme 1102. In accordance with the second flipping scheme 1106, the memory device 240 applies the first flipping scheme 1102, determines respective flipping thresholds 620 of one or more variable nodes 1108 and the next subset of variable nodes 404-2, adjusts the respective flipping thresholds 620 of the one or more variable nodes 1108, and flips the next subset of variable nodes 404-2 based on the respective flipping thresholds 620 of the one or more variable nodes 1108 and the next subset of variable nodes 404-2. In some embodiments, the one or more variable nodes 1108 that have adjusted flipping thresholds 620' include the subset (e.g., all, less than all) of the next subset of variable nodes 404-2 that are flipped. In some embodiments, the one or more variable nodes 1108 that have adjusted flipping thresholds 620' does not include any of the subset of the next subset of variable nodes 404-2 that are flipped. In some embodiments, the one or more variable nodes 1108 that have adjusted flipping thresholds 620' are included in the subset of the next subset of variable nodes 404-2 that are flipped.

In some embodiments, the one or more variable nodes 1108 includes less than all of the plurality of variable nodes 404 involved in the decoding iterations 1110, and the plurality of variable nodes 404 include at least one variable node for which the respective flipping threshold 620 is determined based on the first flipping scheme 1102 without further adjustment. In some embodiments, the one or more variable nodes 1108 include two variable nodes 404 for which the respective flipping thresholds 620 are adjusted with two distinct values (e.g., 1 and 0.4).

In some embodiments, for each of the plurality of check nodes 402, the memory device 240 determines check node data 602 indicating whether a respective set of variable nodes satisfies a data validity condition 610. During each decoding iteration, after bit flipping, updating the check node data 602 of the plurality of check nodes 402 based on variable node data 604 of the subset of respective variable nodes 404-1 that are flipped.

Further, in some embodiments, the memory device 240 determines that the plurality of decoding iterations 1110 do not converge (1104) based on the check node data 602 of the plurality of check nodes 402 during a subset of decoding iterations 1110S, and the subset of decoding iterations 1110S includes a last decoding iteration that concludes the plurality of decoding iterations 1110. In some situations, the subset of decoding iterations 1110S includes less than all of the plurality of decoding iterations 1110. In some situations, the subset of decoding iterations 1110S includes all of the plurality of decoding iterations 1110. In other words, the memory device 240 may use the check node data 602 generated during the last few decoding iterations to decide the decoding iterations 1110 do not converge, and a more aggressive flipping scheme (e.g., the second flipping scheme 1106) needs to be applied.

In some embodiments, the memory device 240 determines that the plurality of decoding iterations 1110 do not converge (1104) when a number of bit flipping 1112 does not change during each of the subset of decoding iterations 1110S. In some embodiments, the memory device 240 determines that the plurality of decoding iterations 1110 do not converge (1104) when a variation of the number of bit flipping 1112 is less than a predefined bit flipping drop for the subset of decoding iterations 1110S. In some embodiments, the memory device 240 determines that the plurality of decoding iterations 1110 do not converge (1104) when a syndrome weight 804 of the plurality of check nodes 402 does not change during each of the subset of decoding iterations 1110S. In some embodiments, the memory device 240 determines that the plurality of decoding iterations 1110 do not converge (1104) when a variation of the syndrome weight 804 of the plurality of check nodes 402 is less than a predefined syndrome drop for the subset of decoding iterations 1110S.

In some embodiments, for each of the subset of respective variable nodes 404-1 of the plurality of decoding iterations 1110 and the next subset of variable nodes 404-2, which are flipped, the memory device 240 determines a conversion factor 606 indicating a quality of the check node data 602 of the plurality of check nodes 402 with reference to variable node data 604 of the plurality of variable nodes 404. For each node 404-1 or 404-2, the memory device 240 determines a respective flip threshold 620 based on the conversion factor 606 and whether to flip the respective variable node 404-1 or 404-2 based on the respective flip threshold 620. More details on determination of the flip threshold 620 are explained above with reference to FIGS. 6-9.

In some embodiments, for each of the subset of respective variable nodes 404-1 of the plurality of decoding iterations 1110 and the next subset of variable nodes 404-2 (e.g., a first variable node 404A in FIG. 7), the memory device 240 determines a first subset of check nodes 402-1 and a second subset of check nodes 402-2 based on check node data 602 of a set of corresponding check nodes 402A. For each of the first subset of check nodes 402-1, the respective set of variable nodes does not satisfy a data validity condition (e.g., having at least one error bit). For each of the second subset of check nodes 402-2, the respective set of variable nodes satisfies the data validity condition (e.g., having no error bit). The memory device 240 determines a first number 702 of check nodes in the first subset of check nodes 404-1, a second number 704 of check nodes in the second subset of check nodes 404-2, and a difference 706 of the first number 702 and the second number 704. Further, in some embodiments, the first flipping scheme 1102 is applied to flip each the subset of respective variable nodes 404-1 in accordance with a determination that the difference 708 exceeds a respective flip threshold 620.

Additionally, in some embodiments, when the second flipping scheme 1106 is applied to flip the next subset of variable nodes 404-2, the memory device 240 determines that the difference exceeds a respective flip threshold 620 for each of a second subset of variable nodes, e.g., the first flipping scheme 1102, and selects the next subset of variable nodes 404-2 from the second subset of variable nodes. In other words, the first flipping scheme 1102 may be applied to select the second subset of variable nodes. However, given a difficulty in convergence, the second flipping scheme 1106 is applied to select the next subset of variable nodes 404-2 to further adjust their flipping thresholds to expedite LDPC decoding.

In some embodiments, the next subset of variable nodes includes a first variable node and a second variable node. The first variable node is flipped based on a first flipping threshold, and the second variable node is flipped based on a second flipping threshold. The first flipping threshold is different from the second flipping threshold, e.g., when the corresponding two variable nodes have the same variable node degree.

In some embodiments, decoding LDPC codewords 302 gets stuck because of trapping sets. Trapping sets are small patterns of variable nodes 404 with bit errors that are difficult to correct. In some situations, at least two variable nodes with bit errors share the same check node, which makes the check node satisfied. Since satisfied check nodes typically mean that the connected variable nodes are correct, an LDPC decoder will have a harder time flipping the bit errors that are connected to satisfied check nodes. Under some circumstances, when a variable node flips, it changes the state of the connected check nodes, which causes another variable node to flip and indirectly causes the first variable node to flip back. This is called an oscillating trapping set. In some implementations, a trapping set is addressed by flipping or erasing one or more bits that are not normally flipped. In some cases, the error bits will be flipped in the process and the trapping set is solved. In other cases, this changes the error pattern enough so that the bit errors are correctable.

Figure 12:
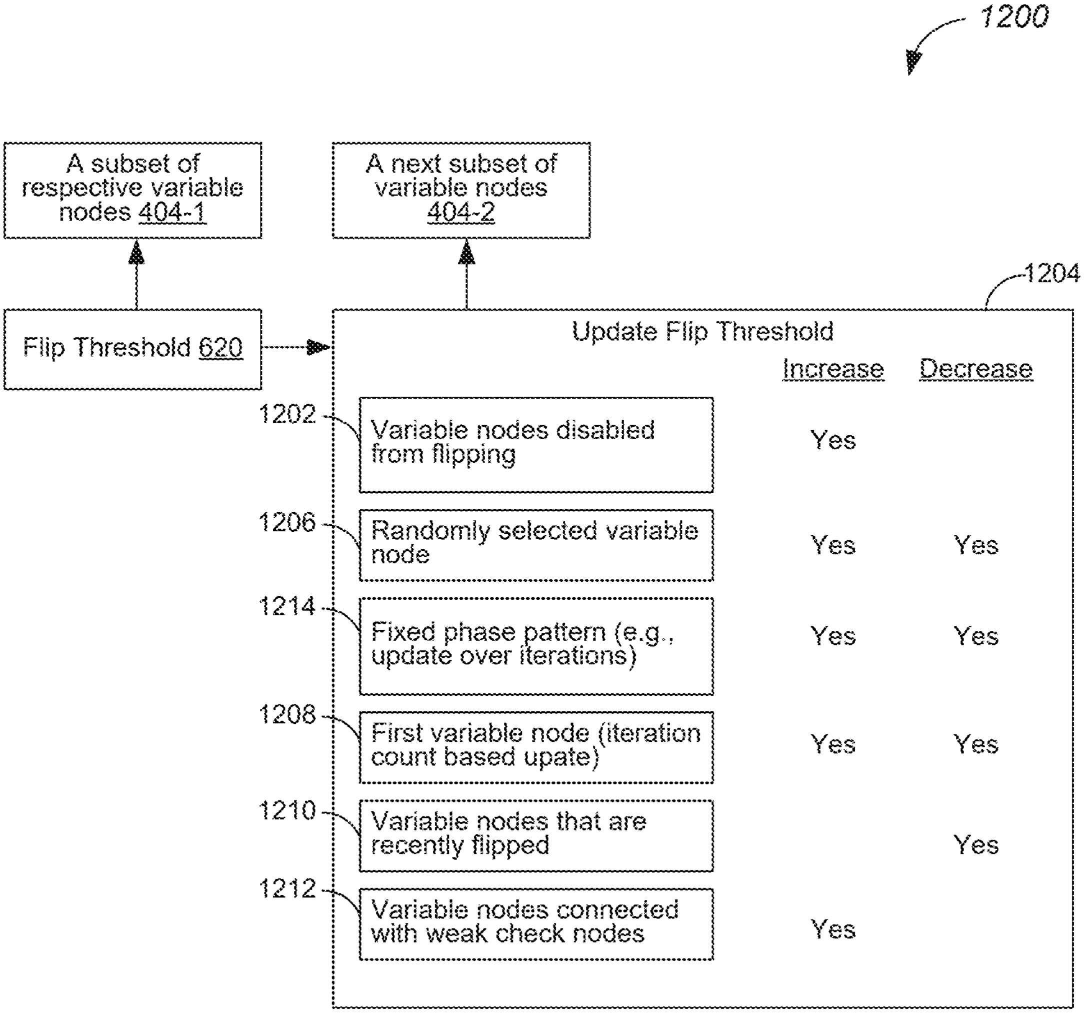
FIG. 12 is a flow diagram of an example process of updating a flip threshold 620 to varying a flipping scheme, in accordance with some embodiments.

FIG. 12 is a flow diagram of an example process 1200 of updating a flip threshold 620 to varying a flipping scheme, in accordance with some embodiments. In some embodiments associated with the second flipping scheme 1106, the memory device 240 breaks an oscillation trapping set associated with the first flipping scheme 1102 by disabling flipping selected bits 1202 on certain iterations (i.e., raising their flip thresholds 620 to infinity), even if the difference 708 of the unsatisfied and satisfied check nodes exceeds the flip threshold 620. Alternatively, in some embodiments associated with the second flipping scheme 1106, the memory device 240 breaks an oscillation trapping set associated with the first flipping scheme 1102 by assigning different flip thresholds 620 to different variable nodes. As such, the flip thresholds 620 of variable nodes 402 are selectively adjusted or updated (operation 1204) to improve data correction performance for data blocks 302 having relatively low bit errors, which often occur among trapping sets.

In some embodiments, a flip threshold 620 associated with the second flipping scheme 1106 is equal to that determined according to the first flipping scheme 1102, except that the variable node 404-2 is not flipped for the first time when its associated difference 706 exceeds the flip threshold 620. The variable node 404-2 flips when the difference 706 associated with the variable node 404-2 exceeds the flip threshold 620 for the second time in a subsequent decoding iteration.

In some embodiments, the memory device 240 selects variable nodes 404 randomly or in a fixed phased pattern 1214 over multiple iterations to have higher or lower flip thresholds 620. For example, when the memory device 240 applies the second flipping scheme 1106 to flip the next subset of variable nodes 404-2, the memory device 240 determines respective flipping thresholds 620 for the plurality of variable nodes 404 based on the first flipping scheme 1102 (e.g., described in FIGS. 7-9), randomly selects a set of variable nodes 1206 among the plurality of variable nodes 404. After varying the respective flipping thresholds 620 of the randomly selected variable nodes 1206, the memory device 240 flips the next subset of variable nodes 404-2 based on the respective flipping thresholds 620.

In some embodiments, the memory device 240 selects the flip threshold 620 of a particular variable node 1208 from a plurality of flip threshold options based on an iteration count. More specifically, when the memory device 240 applies the second flipping scheme 1106 to flip the next subset of variable nodes 404-2, the memory device 240 implements a set of next decoding iterations. For each next decoding iteration having an iteration count, based on the first flipping scheme, the memory device 240 determines a respective flipping threshold 620 for a first variable node 404A, and selects the respective flipping threshold 620 of the first variable node 404A from a plurality of flip threshold options based on the iteration count.

In some embodiments, the memory device 240 selects a different flip threshold for a particular variable node 1210 if the particular variable node 1210 has flipped recently. More specifically, when the memory device 240 applies the second flipping scheme 1106 to flip the next subset of variable nodes 404-2, the memory device 240 determines a respective flipping threshold 620 for a first variable node 404A, and varies (e.g., decreases) the respective flipping threshold 620 of the first variable node 404A in accordance with a determination that the first variable node 404A is flipped recently.

In some embodiments, the plurality of variable nodes 404 include a set of variable nodes and a remainder of variable nodes complementary to the set of variable nodes, and the set of variable nodes has a variable node degree different from that of the remainder variable nodes. The memory device 240 selects each of the set of variable nodes to have a different flip threshold 620.

In some embodiments, the memory device 240 selects a set of variable nodes 1212 to have a different flip threshold 620 in accordance with a determination whether a connected check node of each variable node is weak (e.g., having one or more variable nodes being unreliable, the check node data 602 of the connected check node being small). In some embodiments, when the memory device 240 applies the second flipping scheme 1106 to flip the next subset of variable nodes 404-2, the memory device 240 identifies a first set of check nodes 402A for which variable node data 604 of a first variable node 404A is applied to determine check node data 602 of each of the first set of check nodes 402A, determines a respective flipping threshold 620 for the first variable node 404A based on the first flipping scheme 1102, determines that the first set of check nodes 402A is weak based on the check node data 602 of the first set of check nodes 402A, and varies the respective flipping threshold 620 of the first variable node 404A.

Figure 13:
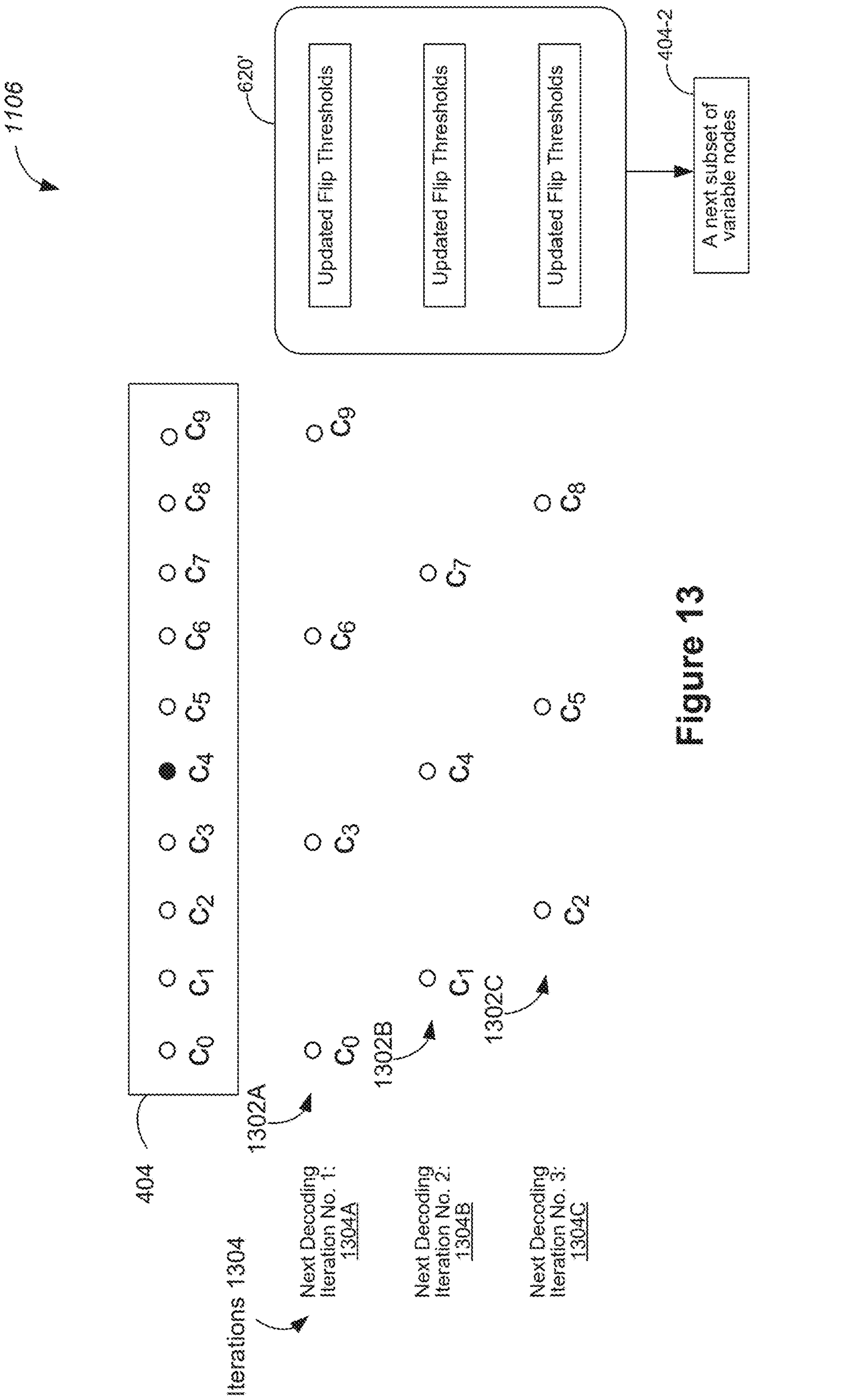
FIG. 13 is a diagram showing a second flipping scheme in which flip threshold of variable nodes are adjusted in a fixed phased pattern over a plurality of decoding iterations, in accordance with some embodiments.

FIG. 13 is a diagram showing a second flipping scheme 1106 in which flip threshold 620 of variable nodes 404 are adjusted in a fixed phased pattern 1214 over a plurality of decoding iterations, in accordance with some embodiments. When the memory device 240 applies the second flipping scheme 1106 to flip the next subset of variable nodes 404-2, the memory device 240 arranges the plurality of variable nodes 404 into a plurality of groups 1302 according to the fixed phased pattern 1214 and implements a set of next decoding iterations 1304 corresponding to the plurality of groups 1302. For each next decoding iteration 1304 (e.g., 1304A, 1304B, 1304C), based on the first flipping scheme 1102, the memory device 240 determines respective flipping thresholds 620 of a corresponding group 1302 (e.g., 1302A, 1302B, and 1302C) of variable nodes, and varies the respective flipping threshold 620 of the corresponding group 1302 (e.g., 1302A, 1302B, and 1302C) of variable nodes. The memory device 240 flips the next subset of variable nodes 404-2 based on the respective flipping thresholds 620 of the corresponding group 1302 of variable nodes during the set of decoding iterations 1304. In accordance with the fixed phased pattern 1214, the first group 1302A includes variable nodes $C_0$, $C_3$, $C_6$, and $C_9$, the second group 1302B includes variable nodes $C_1$, $C_4$, and $C_7$. The third group 1302C includes variable nodes $C_2$, $C_5$, and $C_8$.

Figure 14:
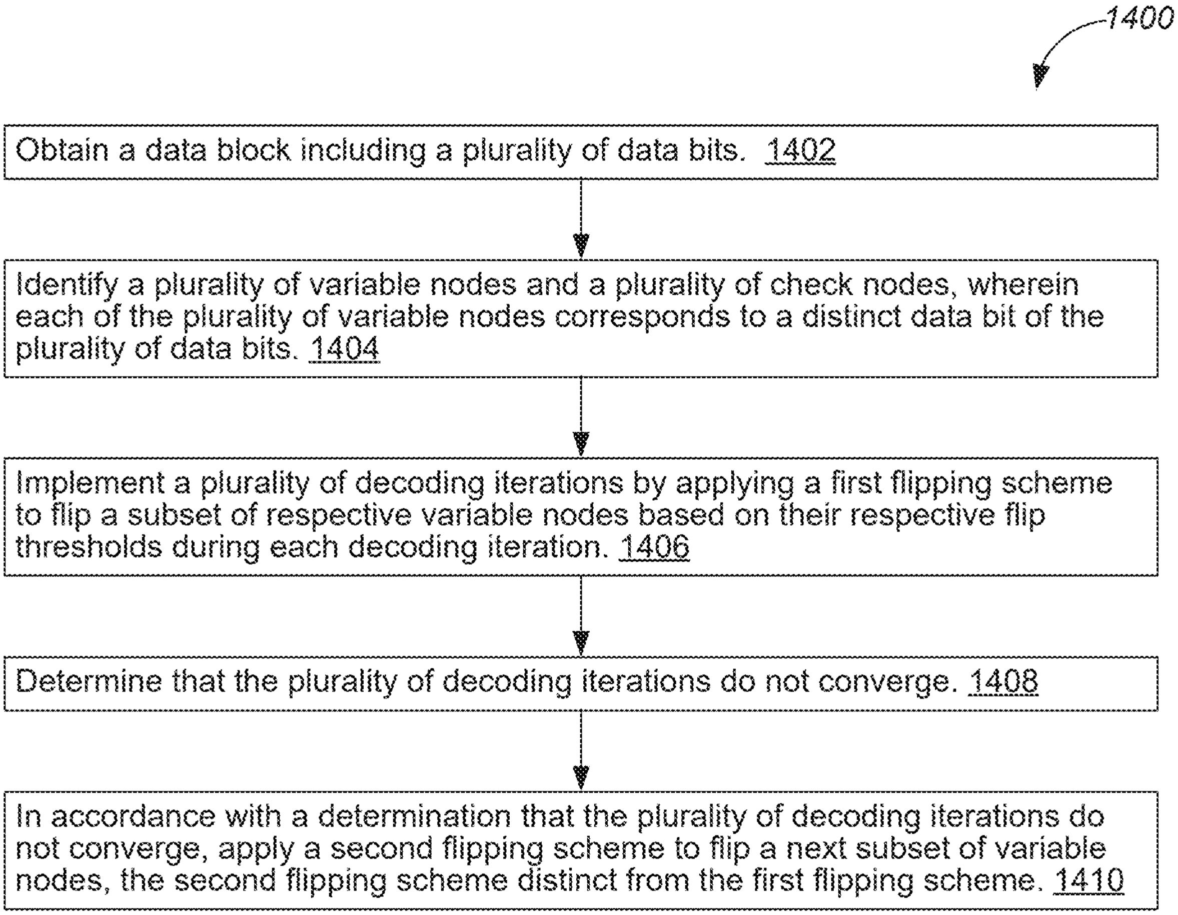
FIG. 14 is a flow diagram of an example process of correcting data bits in a block of data, in accordance with some embodiments.

FIG. 14 is a flow diagram of an example process 1400 of correcting data bits in a block of data, in accordance with some embodiments. In some embodiments, the memory device 240 obtains (operation 1402) a data block including a plurality of data bits and identifies (operation 1404) a plurality of variable nodes and a plurality of check nodes. Each of the plurality of variable nodes corresponds to a distinct data bit of the plurality of data bits. The memory device 240 implements (operation 1406) a plurality of decoding iterations by applying a first flipping scheme to flip a subset of respective variable nodes based on their respective flip thresholds during each decoding iteration. The memory device 240 determines (operation 1408) that the plurality of decoding iterations do not converge. In accordance with a determination that the plurality of decoding iterations do not converge, applies (operation 1410) a second flipping scheme to flip a next subset of variable nodes. The second flipping scheme is distinct from the first flipping scheme.

In some embodiments, when the memory device 240 applies the second flipping scheme to flip the next subset of variable nodes, the memory device determines respective flipping thresholds of one or more variable nodes and the next subset of variable nodes based on the first flipping scheme, adjusts the respective flipping thresholds of the one or more variable nodes, and flips the next subset of variable nodes based on the respective flipping thresholds of the one or more variable nodes and the next subset of variable nodes. Further, in some embodiments, the one or more variable nodes include less than all of the plurality of variable nodes involved in the decoding iterations, and the plurality of variable nodes include at least one variable node for which the respective flipping threshold is determined based on the first flipping scheme without further adjustment. In some embodiments, the one or more variable nodes include two variable nodes for which the respective flipping thresholds are adjusted with two distinct values.

In some embodiments, for each of the plurality of check nodes, the memory device 240 determines check node data indicating whether a respective set of variable nodes satisfies a data validity condition. During each decoding iteration, after bit flipping, the memory device 240 updates the check node data of the plurality of check nodes based on variable node data of the subset of respective variable nodes.

Further, in some embodiments, the memory device 240 determining that the plurality of decoding iterations do not converge further comprises determining that the plurality of decoding iterations do not converge based on the check node data of the plurality of check nodes during a subset of decoding iterations, the subset of decoding iterations including a last decoding iteration that concludes the plurality of decoding iterations.

In some embodiments, for each of the subset of respective variable nodes 404-1 of the plurality of decoding iterations 1110 and the next subset of variable nodes 404-2, the memory device 240 determines a conversion factor indicating a quality of the check node data of the plurality of check nodes with reference to variable node data of the plurality of variable nodes, determines a respective flip threshold based on the conversion factor, and determines whether to flip the respective variable node based on the respective flip threshold.

In some embodiments, when the memory device 240 determines that the plurality of decoding iterations do not converge, the memory device 240 determines one or more of a plurality of conditions including a number of bit flipping not changing during each of the subset of decoding iterations, a variation of the number of bit flipping being less than a predefined bit flipping drop for the subset of decoding iterations, a syndrome weight of the plurality of check nodes not changing during each of the subset of decoding iterations, and a variation of the syndrome weight of the plurality of check nodes being less than a predefined syndrome drop for the subset of decoding iterations.

In some embodiments, the memory device 240 flips the subset of respective variable nodes of each of the plurality of decoding iterations and the next subset of variable node. For each variable node of the subset of respective variable nodes of each of the plurality of decoding iterations and the next subset of variable node, based on check node data of a set of corresponding check nodes, the memory device determines a first subset of check nodes and a second subset of check nodes. For each of the first subset of check nodes, the respective set of variable nodes does not satisfy a data validity condition, and for each of the second subset of check nodes, the respective set of variable nodes satisfies the data validity condition. The memory device determines a first number of check nodes in the first subset of check nodes, a second number of check nodes in the second subset of check nodes, and a difference of the first number and the second number.

Further, in some embodiments, for each of the subset of respective variable nodes, in accordance with a determination that the difference exceeds a respective flip threshold, the memory device flips the respective variable node. In some embodiments, when the memory device 240 applies the second flipping scheme to flip the next subset of variable nodes, the memory device 240 determines that for each of a second subset of variable nodes, the difference exceeds a respective flip threshold, and selects the next subset of variable nodes from the second subset of variable nodes.

In some embodiments, the next subset of variable nodes includes a first variable node and a second variable node. The first variable node is flipped based on a first flipping threshold, and the second variable node is flipped based on a second flipping threshold. The first flipping threshold is different from the second flipping threshold.

In some embodiments, when the memory device 240 applies the second flipping scheme to flip the next subset of variable nodes, it determines respective flipping thresholds for the plurality of variable nodes based on the first flipping scheme. The memory device 240 randomly selects a set of variable nodes among the plurality of variable nodes, and after varying the respective flipping thresholds of the randomly selected variable nodes, flips the next subset of variable nodes based on the respective flipping thresholds.

In some embodiments, when the memory device 240 applies the second flipping scheme to flip the next subset of variable nodes, it arranges the plurality of variable nodes into a plurality of groups according to a fixed phased pattern and implements a set of next decoding iterations corresponding to the plurality of groups. For each next decoding iteration, based on the first flipping scheme, the memory device 240 determines respective flipping thresholds of a corresponding group of variable nodes and varies the respective flipping threshold of the corresponding group of variable nodes. The memory device 240 flips the next subset of variable nodes based on the respective flipping thresholds of the corresponding group of variable nodes during the set of decoding iterations.

In some embodiments, when the memory device 240 applies the second flipping scheme to flip the next subset of variable nodes, the memory device 240 implements a set of next decoding iterations. For each next decoding iteration having an iteration count, based on the first flipping scheme, the memory device 240 determines a respective flipping threshold for a first variable node and selects the respective flipping threshold of the first variable node from a plurality of flip threshold options based on the iteration count.

In some embodiments, when the memory device 240 applies the second flipping scheme to flip the next subset of variable nodes, based on the first flipping scheme, the memory device 240 determines a respective flipping threshold for a first variable node. In accordance with a determination that the first variable node is flipped recently, the memory device 240 varies the respective flipping threshold of the first variable node.

Further, in some embodiments, when the memory device 240 applies the second flipping scheme to flip the next subset of variable nodes, the memory device 240 identifies a first set of check nodes for which variable node data of a first variable node is applied to determine check node data of each of the first set of check nodes. Based on the first flipping scheme, the memory device 240 determines a respective flipping threshold for the first variable node, determines that the first set of check nodes is weak based on the check node data of the first set of check nodes, and varies the respective flipping threshold of the first variable node.

Memory is also used to store instructions and data associated with the method 1400, and includes high-speed random-access memory, such as SRAM, DDR DRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 1400. Alternatively, in some embodiments, the electronic device implements the method 1400 at least partially based on an ASIC. The memory system 200 of the electronic device includes an SSD in a data center or a client device.

Determination of Min-Sum Scaling Factors

Figure 15:
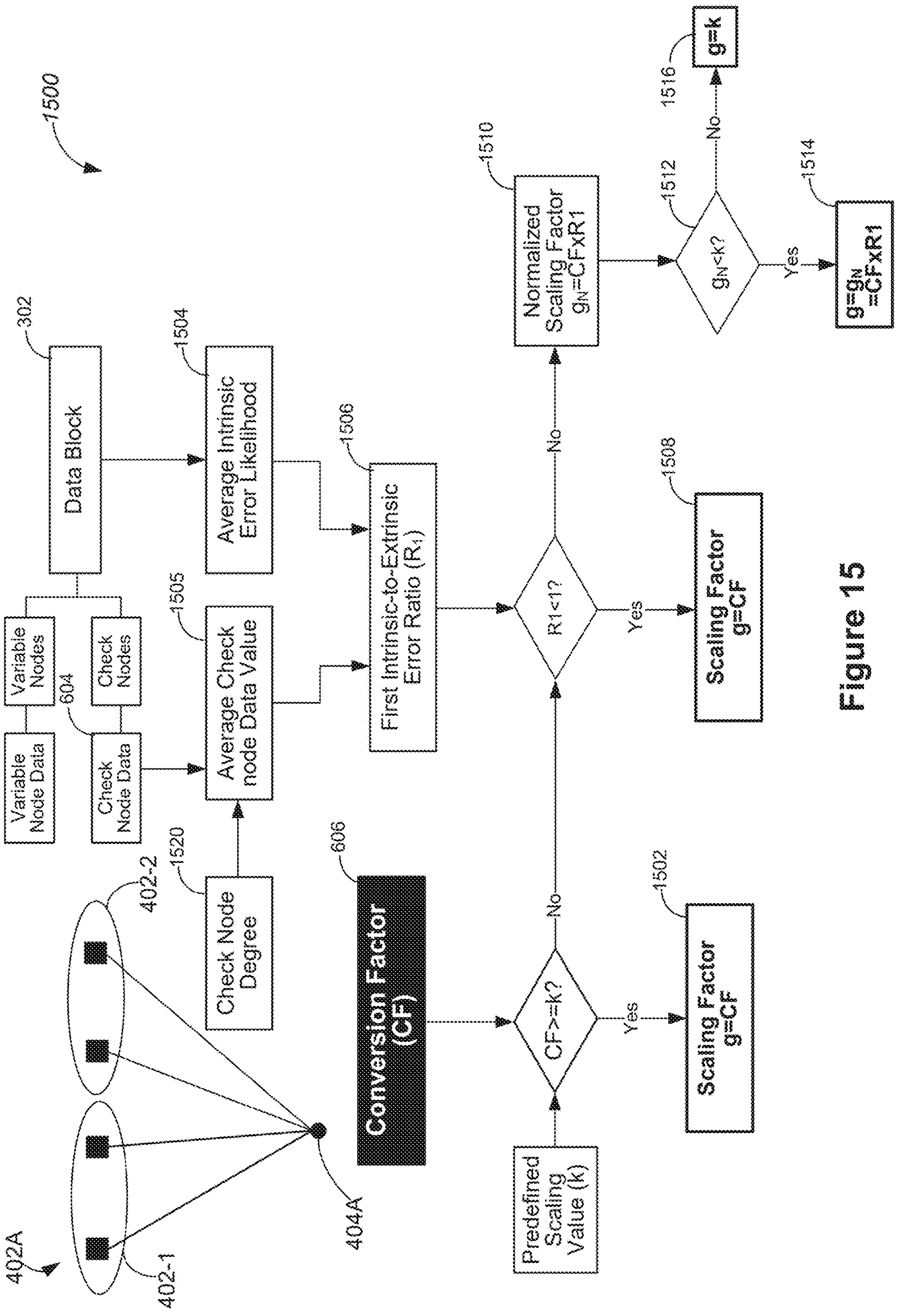
FIG. 15 is a flow diagram of an example process of controlling a scaling factor g applied to determine variable node data of a plurality of variable nodes, in accordance with some embodiments.

FIG. 15 is a flow diagram of an example process 1500 of controlling a scaling factor g applied to determine variable node data 604 of a plurality of variable nodes 402, in accordance with some embodiments. The process 1500 is implemented by a memory controller 202 to validate a block of data 302 and correct one or more bit errors in a block of data 302 during the course of reading the block of data 302 from associated non-volatile memory (e.g., memory channels 204). In some embodiments, the data block 302 includes a plurality of data bits (e.g., corresponding to user data 302D or integrity data 302I). The plurality of data bits correspond to a plurality of variable nodes 404 and a plurality of check nodes 402, and each of the plurality of variable nodes 404 corresponds to a distinct data bit of the plurality of data bits of the data block 302. For each of the plurality of check nodes 402, check node data 602 is determined (e.g., during each LDPC decoding iteration) to indicate whether the respective check node 402 and a respective set of variable nodes 404 satisfy a data validity condition 610.

For a first variable node 404A, the memory device 240 determines a conversion factor 606 (e.g., in FIG. 6) indicating a quality of the check node data 602 of the plurality of check nodes 402 with reference to variable node data 604 of the first variable node 404A. The memory device 240 identifies a first set of check nodes 402A for which the variable node data 604 of the first variable node 404A is applied to determine the check node data 602 of each of the first set of check nodes 402A. The memory device 240 determines a scaling factor g based on at least the conversion factor 606, and determining variable node data 604 of the first variable node 404A by at least applying the scaling factor g to the check node data 602 of the first set of check nodes 402A. In some embodiments, for the first variable node 404A, the memory device 240 determines a product of the scaling factor g and a sum of the check node data 602 (e.g., $u_k$) of the first set of check nodes 402A, and the variable node data 604 (e.g., $v_m$) of the first variable node 404A includes a sum of a hard decision likelihood $u_0$ and the product, e.g. according to equation (7).

In some embodiments, the scaling factor g is capped at a predefined scaling value k. In some embodiments, in accordance with a determination that the conversion factor 606 is greater than or equal to a predefined scaling value k, the memory device 240 sets (operation 1502) the scaling factor g to the conversion factor 606.

In some embodiments, the check node data 602 are determined for a current iteration of a plurality of decoding iterations, and the scaling factor g is determined independently of a variable node degree of the first variable node 404A and an iteration count of the current iteration.

In some embodiments, the memory device determines an average intrinsic error likelihood 1504 of the plurality of data bits of the data block 302, a first intrinsic-to-extrinsic error ratio 1506 of the average intrinsic error likelihood 1504 of the plurality of data bits, and an average check node data value 1505 of the first set of check nodes 402A. The scaling factor g is determined based on both the conversion factor 606 and the first intrinsic-to-extrinsic error ratio 1506. In some situations, in accordance with a determination that the conversion factor 606 is less than a predefined scaling value k and that the first intrinsic-to-extrinsic error ratio 1506 is less than 1, the scaling factor g is set (operation 1508) to the conversion factor 606.

Alternatively, in some embodiments, in accordance with a determination that the conversion factor 606 is less than a predefined scaling value k and that the first intrinsic-to-extrinsic error ratio 1506 is equal to or greater than 1, the memory device 240 generates a normalized scaling factor 1510 ($g_N$) based on the conversion factor 606 and the first intrinsic-to-extrinsic error ratio 1506. The memory device 240 compares (operation 1512) the normalized scaling factor 1510 ($g_N$) with the predefined scaling value k. Further, in some embodiments, in accordance with a determination that the normalized scaling factor is less than the predefined scaling value k, the scaling factor g is set (operation 1514) as the normalized scaling factor 1510 ($g_N$). Alternatively, in some embodiments, in accordance with a determination that the normalized scaling factor 1510 ($g_N$) is great than or equal to the predefined scaling value k, the scaling factor g is set (operation 1516) as the predefined scaling value k.

In some embodiments, the memory device 240 determines a current syndrome weight 804C ($SW_C$) based on the check node data 602 of the plurality of check nodes 402. The memory device 240 determines a first check node degree 1520 for the first set of check nodes 402A, and checks a pre-determined graph, lookup table, or mathematical formula describing a relationship of a scaling factor g and a combination of the current syndrome weight 804C ($SW_C$), the first check node degree 1520, the first intrinsic-to-extrinsic error ratio 1506, and the conversion factor 606 to determine the scaling factor g of the first variable node 404A.

In some embodiments, the memory device 240 determines a current syndrome weight 804C ($SW_C$) based on the check node data 602 of the plurality of check nodes 402. The memory device 240 determines a first check node degree 1520 for the first set of check nodes 402A. The variable node data 604 of the first variable node 402A are determined based on the current syndrome weight 804C ($SW_C$) and the check node degree 1520 of each of the first set of check nodes.

In some embodiments, the memory device 240 implements a plurality of decoding iterations each of which includes a plurality of clock cycles, wherein the scaling factor g is determined for each clock cycle or each decoding iteration.

In some embodiments, the scaling factor g of equation (7) is determined for the first variable node 404A based on a variable node degree (e.g., a number of check nodes in the first set of check nodes 404) and an iteration count.

Alternatively, in some embodiments, the scaling factor g of equation (7) is determined for the first variable node 404A is determined based on one or more of: a current syndrome weight 804C ($SW_C$), a check node degree 1520 (e.g., a number of variable nodes 404 connected to each check node 402), a first intrinsic-to-extrinsic error ratio 1506, and a conversion factor 606 (FIG. 6). In some situations, a lower scaling factor g corresponds to a higher syndrome weight 804, which indicates that check nodes 402 are less reliable. In some situations, a lower scaling factor g corresponds to a higher check node degree (which indicates that check nodes 402 are less reliable). In some situations, if all of the check nodes 402 have a similar degree, the check node degree 1520 is substantially constant. In some implementations, the first intrinsic-to-extrinsic error ratio 1506 ($\eta$) is represented as follows:

$$\eta = (\text{average nonzero intrinsic LLR magnitude})/(\text{average nonzero check node minimum magnitude}) \quad (14)$$

A higher scaling factor g corresponds to a higher first intrinsic-to-extrinsic error ratio 1506 ($\eta$), and normalization may be applied. Nonzero check node minimum magnitude corresponds to the most minimum variable-to-check node message data (Min1) carried in the check node data 602 of each check node 402, and is averaged to determine the average check node data value 1505. The second minimum variable-to-check node message data (Min2) are used less frequently than the most minimum variable-to-check node message data (Min1), and is excluded for simplicity in some embodiments. In some embodiments, the conversion factor 606 depends on an initial syndrome weight 804I ($SW_I$), a current syndrome weight 804C ($SW_C$), and the check node degree. More details on determining the conversion factor 606 are discussed above with reference to FIGS. 6-9.

In some embodiments, the memory device 240 create a lookup table of conversion factors 606 based on syndrome weights (e.g. an initial syndrome weight 804I ($SW_I$)) and a check node degree 1520. When LDPC decoding initiates, the memory device 240 determine the average intrinsic error likelihood 1504 based on an the average nonzero intrinsic LLR magnitude. During decoding, the memory device 240 determines the scaling factor g for each check node degree 1520, and checks the lookup table 806 to determine the conversion factor 606. In some embodiments, if the conversion factor 606 is equal to or greater than (≥) the predefined scaling value k (e.g., where k is equal to 0.625), the scaling factor g is set (operation 1502) to the conversion factor 606.

Conversely, if the conversion factor 606 is less than the predefined scaling value k, the memory device 240 determines the average check node data value 1505, e.g., based on samples of the most minimum variable-to-check node message data (Min1) carried in the check node data 602. The memory device 240 further determines the first intrinsic-to-extrinsic error ratio 1506. In accordance with a determination that the first intrinsic-to-extrinsic error ratio 1506 is less than 1, the scaling factor g is set (operation 1508) to the conversion factor 606. In accordance with a determination that the first intrinsic-to-extrinsic error ratio 1506 is equal to or greater than 1, the scaling factor g is set (operation 1516) to the predefined scaling value k.

In some embodiments, the lookup table of conversion factors 606 for different syndrome weights and check node degree 1520 are estimated using mathematical formulas or determined empirically. The memory device 240 determines a normalized scaling factor 1510 by multiplying the lookup table scaling factor g with the first intrinsic to extrinsic error ratio 1506. In some embodiments, the check node minimum messages (Min1) of the check node data 602 are very small, resulting in large ratios 1506 and large scaling factors g, which are capped at the predefined scaling value k (e.g., 0.625). In some embodiments, the first intrinsic to extrinsic error ratio 1506 is less than 1 (e.g., when LDPC decoding is close to an end), scaling factor normalization is aborted.

In some embodiments, selection of the scaling factor g does not work until after the syndrome weight 804 has been calculated for the first time in the first iteration. The scaling factors g are not used during the first iteration. In some embodiments, a scaling factor g is selected and updated for each clock cycle as the syndrome weight 804 and the average nonzero check node minimum magnitudes (Min1) (e.g., average check node data value 1505) are changing. Alternatively, the scaling factor g is updated less frequently, e.g. once per iteration. In some embodiments, the average intrinsic error likelihood 1504 and average check node data value 1505 are determined based on nonzero magnitudes in case there are erased or punctured bits.

In some embodiments, a scaling factor g equal to 0.75 is used for variable nodes 404 having a variable node degree of 3, and a scaling factor g equal to 0.625 is used for variable nodes 404 having other variable node degrees. In some embodiments, the scaling factor g starts lower than 0.625, and settles at 0.625. In some embodiments, the scaling factor g starts at 0.625 and stays at 0.625. In some embodiments, near the end of LDPC decoding, the scaling factor g increases to 0.75 and 1.0. In some embodiments, an RBER improves up to 2%.

Figure 16:
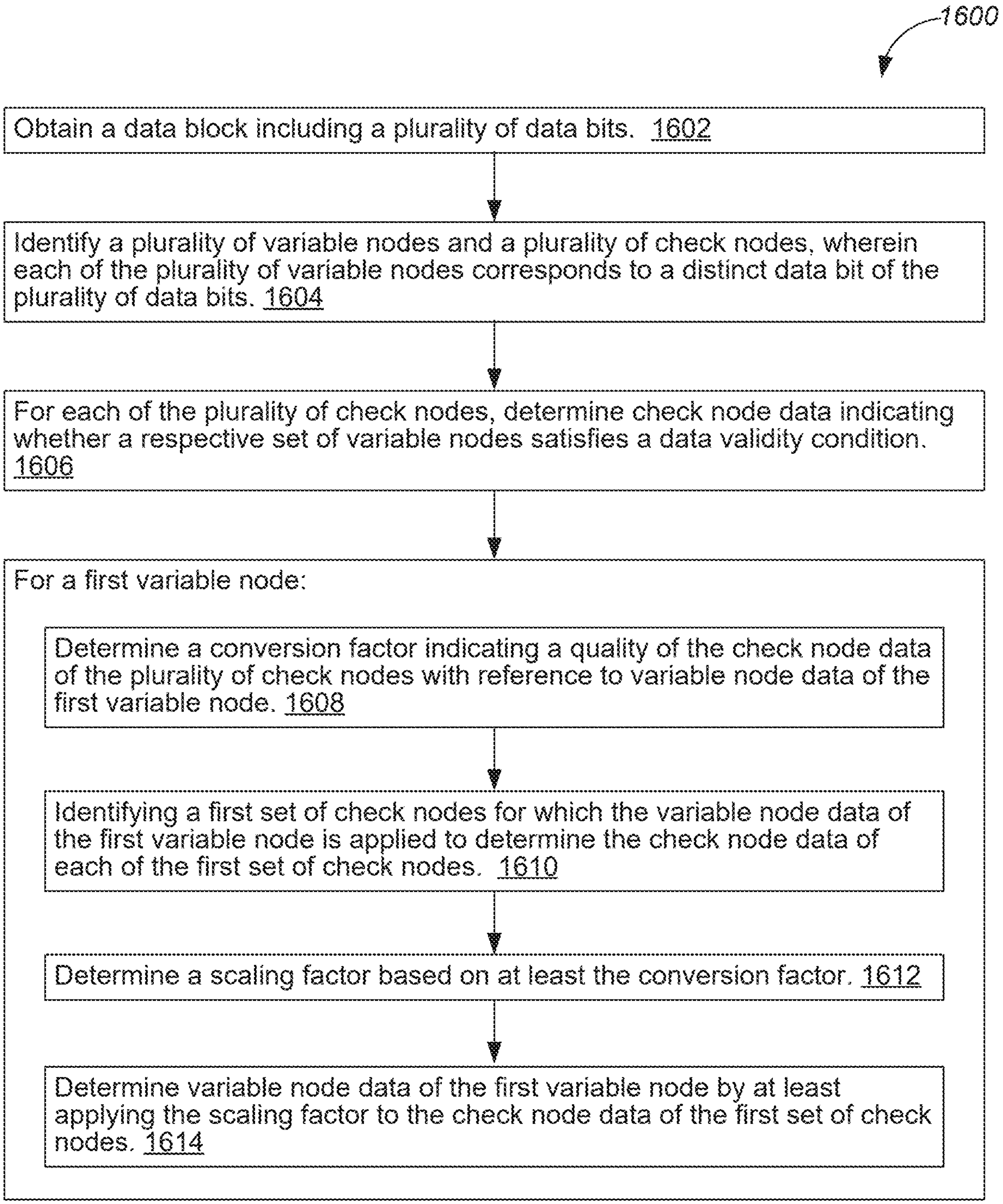
FIG. 16 is a flow diagram of an example process of validating data during LDPC decoding, in accordance with some embodiments.

FIG. 16 is a flow diagram of an example method 1600 of validating data during LDPC decoding, in accordance with some embodiments. The method 1600 is implemented by a memory device 240 (FIG. 2). The memory device obtains (operation 1602) a data block including a plurality of data bits and identifies (operation 1604) a plurality of variable nodes and a plurality of check nodes. Each of the plurality of variable nodes corresponds to a distinct data bit of the plurality of data bits. For each of the plurality of check nodes, the memory device 240 determines (operation 1606) check node data indicating whether a respective set of variable nodes satisfies a data validity condition. For a first variable node, the memory device 240 determines (operation 1608) a conversion factor indicating a quality of the check node data of the plurality of check nodes with reference to variable node data of the first variable node, identifies (operation 1610) a first set of check nodes for which the variable node data of the first variable node is applied to determine the check node data of each of the first set of check nodes, determines (operation 1612) a scaling factor based on at least the conversion factor, and determines (operation 1614) variable node data of the first variable node by at least applying the scaling factor to the check node data of the first set of check nodes.

In some embodiments, for the first variable node, the memory device 240 determines a product of the scaling factor and a sum of the check node data of the first set of check nodes. The variable node data of the first variable node includes a sum of a hard decision likelihood $u_0$ and the product.

In some embodiments, the memory device 240 determines the scaling factor further comprises capping the scaling factor at a predefined scaling value.

In some embodiments, the memory device 240 determines the scaling factor further comprises that in accordance with a determination that the conversion factor is greater than or equal to a predefined scaling value, setting the scaling factor to the conversion factor.

In some embodiments, the check node data are determined for a current iteration of a plurality of decoding iterations, and the scaling factor is determined independently of a variable node degree of the first variable node and an iteration count of the current iteration.

In some embodiments, the memory device 240 determines an average intrinsic error likelihood of the plurality of data bits. The memory device 240 determines a first intrinsic-to-extrinsic error ratio of the average intrinsic error likelihood of the plurality of data bits and an average check node data value of the first set of check nodes. The scaling factor is determined based on both the conversion factor and the first intrinsic-to-extrinsic error ratio. Further, in some embodiments, in accordance with a determination that the conversion factor is less than a predefined scaling value and that the first intrinsic-to-extrinsic error ratio is less than 1, the memory device 240 sets the scaling factor to the conversion factor. In some embodiments, in accordance with a determination that the conversion factor is less than a predefined scaling value and that the first intrinsic-to-extrinsic error ratio is equal to or greater than 1, the memory device generates a normalized scaling factor based on the conversion factor and the first intrinsic-to-extrinsic error ratio and compares the normalized scaling factor with the predefined scaling value. Additionally, in some embodiments, in accordance with a determination that the normalized scaling factor is less than the predefined scaling value, the memory device 240 sets the scaling factor as the normalized scaling factor. Conversely, in some embodiments, in accordance with a determination that the normalized scaling factor is great than or equal to the predefined scaling value, the memory device 240 sets the scaling factor as the predefined scaling value.

In some embodiments, the memory device 240 determines a current syndrome weight based on the check node data of the plurality of check nodes, determines a first check node degree for the first set of check nodes, and checks a pre-determined graph, lookup table, or mathematical formula describing a relationship of a scaling factor and a combination of the current syndrome weight, the first check node degree, the first intrinsic-to-extrinsic error ratio, and the conversion factor, thereby determining the scaling factor of the first variable node.

In some embodiments, the memory device 240 determines a current syndrome weight based on the check node data of the plurality of check nodes. The memory device 240 determines a check node degree for each of the first set of check nodes. The variable node data of the first variable node are determined based on the current syndrome weight and the check node degree of each of the first set of check nodes.

In some embodiments, the memory device 240 implements a plurality of decoding iterations each of which includes a plurality of clock cycles, wherein the scaling factor is determined for each clock cycle or each decoding iteration.

Memory is also used to store instructions and data associated with the method 1600, and includes high-speed random-access memory, such as SRAM, DDR DRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 1600. Alternatively, in some embodiments, the electronic device implements the method 1600 at least partially based on an ASIC. The memory system 200 of the electronic device includes an SSD in a data center or a client device.

It should be understood that the particular order in which the operations in FIGS. 6-16 have been described are merely exemplary and are not intended to indicate that the described order is the only order in which the operations could be performed. One of ordinary skill in the art would recognize various ways to reorder the operations described herein. Additionally, it should be noted that details of other processes described herein with respect to a process in any of FIGS. 6-16 are also applicable in an analogous manner to processes described above with respect to other figures of FIGS. 6-16. For brevity, these details are not repeated.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory, optionally, stores a subset of the modules and data structures identified above. Furthermore, the memory, optionally, stores additional modules and data structures not described above.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method for correcting data errors, comprising:

obtaining a data block including a plurality of data bits;

identifying a plurality of variable nodes and a plurality of check nodes, wherein each of the plurality of variable nodes corresponds to a distinct data bit of the plurality of data bits;

for each of the plurality of check nodes, determining check node data indicating whether a respective set of variable nodes satisfies a data validity condition; and for a first variable node:

identifying a first set of check nodes for which variable node data of the first variable node is applied to determine the check node data of each of the first set of check nodes;

determining a conversion factor indicating a quality of the check node data of the first set of check nodes with reference to the variable node data of the first variable node;

determining a flip threshold based on the conversion factor; and determining whether to flip the first variable node based on the flip threshold and the check node data of the first set of check nodes.

2. The method of claim 1, further comprising:

based on the check node data of the first set of check nodes, determining a first subset of check nodes and a second subset of check nodes, wherein for each of the first subset of check nodes, the respective set of variable nodes does not satisfy the data validity condition, and for each of the second subset of check nodes, the respective set of variable nodes satisfies the data validity condition;

determining a first number of check nodes in the first subset of check nodes and a second number of check nodes in the second subset of check nodes; and determining a difference of the first number and the second number, wherein whether to flip the first variable node is determined based the flip threshold and the difference.

3. The method of claim 2, further comprising:

in accordance with a determination that the difference exceeds the flip threshold, flipping the first variable node.

4. The method of claim 2, further comprising:

scaling the difference to generate a scaled difference; and in accordance with a determination that the scaled difference exceeds the flip threshold, flipping the first variable node.

5. The method of claim 2, further comprising:

adjusting the difference by a margin value to generate an adjusted difference; and in accordance with a determination that the adjusted difference exceeds the flip threshold, flipping the first variable node.

6. The method of claim 5, further comprising determining the margin value based on an initial RBER and the conversion factor.

7. The method of claim 2, further comprising:

scaling the difference to generate a scaled difference;

adjusting the scale difference by a margin value to generate an adjusted difference;

scaling the flip threshold to generate a scaled flip threshold; and in accordance with a determination that the adjusted difference exceeds the scaled flip threshold, flipping the first variable node.

8. The method of claim 1, wherein determining the flip threshold based on the conversion factor further comprises:

determining whether the first variable node is flipped in a last decoding iteration;

in accordance with a determination that the first variable node is flipped in the last decoding iteration, setting the flip threshold to the conversion factor; and in accordance with a determination that the first variable node is not flipped in the last decoding iteration, setting the flip threshold to a product of the conversion factor and −1.

9. The method of claim 1, wherein determining the flip threshold based on the conversion factor further comprises:

in accordance with a determination that the first variable node is not flipped in a last decoding iteration, setting the flip threshold to a product of the conversion factor and a scaling value, wherein an absolute value of the scaling value is between 0 to 1.

10. The method of claim 1, wherein determining the conversion factor further comprises:

determining an initial syndrome weight based on the plurality of data bits;

determining a current syndrome weight based on the check node data of the plurality of check nodes; and checking a predetermined lookup table or mathematical formula associating the conversion factor with the initial syndrome weight and the current syndrome weight to determine the conversion factor.

11. The method of claim 1, wherein the first set of check nodes includes a number of check nodes ($N_C$) in total, and determining a conversion factor further comprises:

determining an input residual bit error rate (RBER) of the plurality of variable nodes;

determining an intrinsic error likelihood value based on the input RBER;

determining an extrinsic error likelihood value based on the number of check nodes ($N_C$); and determining the conversion factor as a ratio of the intrinsic error likelihood value and the extrinsic error likelihood value.

12. The method of claim 11, wherein determining the input RBER further comprises:

determining an initial syndrome weight; and checking a pre-determined graph, lookup table, or mathematical formula describing a relationship of the initial syndrome weight and the input RBER to determine to the input RBER based on the initial syndrome weight.

13. The method of claim 11, wherein determining the input RBER further comprises:

determining an initial syndrome weight; and determining a variable node degree, wherein the input RBER is determined based on the initial syndrome weight and the variable node degree.

14. The method of claim 11, wherein determining the input RBER further comprises:

determining a current syndrome weight ($SW_C$) based on the check node data of the plurality of check nodes; and determining a syndrome weight fraction (SWR) as a ratio between the current syndrome weight ($SW_C$) and the number of check nodes ($N_C$), wherein the intrinsic error likelihood value (ILV) and the extrinsic error likelihood value (ELV) is represented as follows:

$$IVR = \frac{1 - \text{input } RBER}{\text{input } RBER} \text{ and } EVR = \frac{1 - SWR}{SWR}.$$

15. The method of claim 1, further comprising:

in accordance with a determination that the first variable node corresponds to an erased bit, setting the conversion factor to 0.

16. An electronic device, comprising:

one or more processors; and memory storing one or more programs for execution by the one or more processors, the one or more programs including instructions for:

obtaining a data block including a plurality of data bits;

identifying a plurality of variable nodes and a plurality of check nodes, wherein each of the plurality of variable nodes corresponds to a distinct data bit of the plurality of data bits;

for each of the plurality of check nodes, determining check node data indicating whether a respective set of variable nodes satisfies a data validity condition; and for a first variable node:

determining a conversion factor indicating a quality of the check node data of the plurality of check nodes with reference to variable node data of the first variable node;

identifying a first set of check nodes for which the variable node data of the first variable node is applied to determine the check node data of each of the first set of check nodes;

determining a flip threshold based on the conversion factor; and determining whether to flip the first variable node based on the flip threshold and the check node data of the first set of check nodes.

17. The electronic device of claim 16, the one or more programs further comprising instructions for:

based on the check node data of the first set of check nodes, determining a first subset of check nodes and a second subset of check nodes, wherein for each of the first subset of check nodes, the respective set of variable nodes does not satisfy the data validity condition, and for each of the second subset of check nodes, the respective set of variable nodes satisfies the data validity condition;

determining a first number of check nodes in the first subset of check nodes and a second number of check nodes in the second subset of check nodes; and determining a difference of the first number and the second number, wherein whether to flip the first variable node is determined based the flip threshold and the difference.

18. The electronic device of claim 17, the one or more programs further comprising instructions for:

in accordance with a determination that the difference exceeds the flip threshold, flipping the first variable node.

19. A non-transitory computer-readable storage medium storing one or more programs for execution by one or more processors, the one or more programs comprising instructions for:

obtaining a data block including a plurality of data bits;

identifying a plurality of variable nodes and a plurality of check nodes, wherein each of the plurality of variable nodes corresponds to a distinct data bit of the plurality of data bits;

for each of the plurality of check nodes, determining check node data indicating whether a respective set of variable nodes satisfies a data validity condition; and for a first variable node:

determining a conversion factor indicating a quality of the check node data of the plurality of check nodes with reference to variable node data of the first variable node;

identifying a first set of check nodes for which the variable node data of the first variable node is applied to determine the check node data of each of the first set of check nodes;

determining a flip threshold based on the conversion factor; and determining whether to flip the first variable node based on the flip threshold and the check node data of the first set of check nodes.

20. The non-transitory computer-readable storage medium of claim 19, the one or more programs further comprising instructions for:

based on the check node data of the first set of check nodes, determining a first subset of check nodes and a second subset of check nodes, wherein for each of the first subset of check nodes, the respective set of variable nodes does not satisfy the data validity condition, and for each of the second subset of check nodes, the respective set of variable nodes satisfies the data validity condition;

determining a first number of check nodes in the first subset of check nodes and a second number of check nodes in the second subset of check nodes;

determining a difference of the first number and the second number, wherein whether to flip the first variable node is determined based the flip threshold and the difference; and in accordance with a determination that the difference exceeds the flip threshold, flipping the first variable node.

* * * * *